(12) United States Patent
Bandyopadhyay et al.

(10) Patent No.: US 10,886,937 B1
(45) Date of Patent: Jan. 5, 2021

(54) METHOD TO EMBED ELD DAC IN SAR QUANTIZER

(71) Applicant: Analog Devices International Unlimited Company, Limerick (IE)

(72) Inventors: Abhishek Bandyopadhyay, Winchester, MA (US); Akira Shikata, Everett, MA (US); Keith Anthony O'Donoghue, Cork (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/654,930

(22) Filed: Oct. 16, 2019

(51) Int. Cl.
| | |
|---|---|
| H03M 1/06 | (2006.01) |
| H03M 3/00 | (2006.01) |
| H03M 1/00 | (2006.01) |
| H03M 1/12 | (2006.01) |
| H03M 1/80 | (2006.01) |

(52) U.S. Cl.
CPC ............ H03M 3/37 (2013.01); H03M 3/422 (2013.01); H03M 3/464 (2013.01); H03M 3/496 (2013.01); H03M 1/001 (2013.01); H03M 1/06 (2013.01); H03M 1/12 (2013.01); H03M 1/804 (2013.01); H03M 3/30 (2013.01)

(58) Field of Classification Search
CPC .......... H03M 1/06; H03M 3/30; H03M 1/001; H03M 1/12; H03M 1/804
USPC .......................... 341/118, 143, 110, 155, 172
See application file for complete search history.

(56) References Cited

U.S. PATENT DOCUMENTS

| | | | |
|---|---|---|---|
| 9,325,341 B2 | 4/2016 | Dagher et al. | |
| 9,385,740 B2 | 7/2016 | Wang et al. | |
| 9,577,662 B2 | 2/2017 | Wei et al. | |
| 9,819,357 B1* | 11/2017 | Guo ................... | H03M 1/0607 |
| 9,871,534 B2 | 1/2018 | Tsai et al. | |
| 2016/0233872 A1* | 8/2016 | Wei ....................... | H03M 3/37 |
| 2018/0219558 A1 | 8/2018 | Chiu et al. | |

OTHER PUBLICATIONS

Liu, Jiaxin, et al., "A 0.029-mm Squared 17-fJ/Conversion-Step Third-Order CT Delta Sigma ADC With a Single OTA and Second-Order Noise-Shaping SAR Quantizer", IEEE Journal of Solid-State Circuits, (2018), 13 pgs.
Liu, Jiaxin, et al., "A 0.029-mm Squared 17-fJ/Conv.-Step CT Delta Sigma ADC With 2nd-Order Noise-Shaping SAR Quantizer", IEEE Symposium on VLSI Circuits Digest of Papers, (2018), 2 pgs.

(Continued)

*Primary Examiner* — Joseph J Lauture
(74) *Attorney, Agent, or Firm* — Schwegman Lundberg & Woessner, P.A.

(57) ABSTRACT

Methods and devices are described for controlling excess loop delay (ELD) gain compensation in a digital-to-analog converter (DAC) of a successive approximation register (SAR) analog-to-digital converter (ADC) by using DAC unit elements in the ELD DAC and DACs for the SAR ADC efficiently. The ELD DAC and DAC partially share DAC units (e.g. capacitors or current sources) to minimize total DAC units used to limit area and power usage while maintaining operational flexibility. Different configurations provide ELD gains of less than or greater than one. A dedicated sampling capacitor is also provided to allow flexible gain control by capacitance ratio.

35 Claims, 18 Drawing Sheets

(56) References Cited

OTHER PUBLICATIONS

Radjen, Dejan, et al., "A low-power 2nd-order CT delta—sigma modulator with an asynchronous SAR quantizer", Analog Integrated Circuits and Signal Processing, (80)3, (2015), 12 pgs.

Ranjbar, Mohammad, et al., "A 3.1 mW Continuous-Time Delta Sigma Modulator With 5-Bit Successive Approximation Quantizer for WCDMA", IEEE Journal of Solid-State Circuits, 45(8), (Aug. 2010), 13 pgs.

Wang, Chi-Yun, et al., "A Mode-Configurable Analog Baseband for Wi-Fi 11 ac Direct-Conversion Receiver Utilizing a Single Filtering Delta Sigma ADC", IEEE Radio Frequency Integrated Circuits Symposium, (2016), 4 pgs.

Wang, Chi-Yun, et al., "An 80MHz-BW 31.9fJ/conv-step Filtering Delta Sigma ADC with a Built-In DAC-Segmentation/ELD-Compensation 6b 960MS/s SAR-Quantizer in 28nm LP for 802.11ax Applications", IEEE Intl. Solid-State Circuits Conference (ISSCC) Session 20, Noise-Shaped and VCO-Based ADCs, (2019), 3 pgs.

Wei, Guowen, et al., "A 13-ENOB, 5 MHz BW, 3.16 mW Multi-Bit Continuous-Time Delta Sigma ADC in 28 nm CMOS with Excess-Loop-Delay Compensation Embedded in SAR Quantizer", IEEE Symposium on VLSI Circuits, (Jun. 2015), 2 pgs.

Wu, Bo, et al., "A 24.7 mW 65 nm CMOS SAR-Assisted CT Delta Sigma Modulator With Second-Order Noise Coupling Achieving 45 MHz Bandwidth and 75.3 dB SNDR", IEEE Journal of Solid-State Circuits, 51(12), (Dec. 2016), 13 pgs.

Zhou, M., et al., "A 2 GHz 0.98 mW 4-bit SAR-Based Quantizer with ELD Compensation in an UWB CT Sigma Delta Modulator", IEEE Intl. Symposium on Circuits and Systems (ISCAS), (2018), 5 pgs.

\* cited by examiner

METHOD TO EMBED ELD DAC IN SAR QUANTIZER

FIELD OF THE DISCLOSURE

This document pertains generally, but not by way of limitation, to integrated circuits, and more particularly, to Analog-to-Digital Converter (ADC) circuits.

BACKGROUND

An analog-to-digital converter (ADC) circuit may be used to convert an analog signal to a digital signal, which may then be further processed or used in the digital domain. Continuous Time (CT) Delta Sigma (DS) ADCs are good at precision and low power applications and use Successive Approximation Register (SAR) ADCs as quantizers to reduce power. A SAR ADC circuit may carry out bit trials to compare portions of the analog signal to a reference voltage to determine the digital bit values of a digital word representing a particular sample of the analog signal. A SAR ADC may use a capacitor array of a Digital-to-Analog Converter (DAC) for carrying out the bit trials for determining the respective digital bit values of the digital word. SAR ADCs are desirable because they require low power. However, the successive nature of the conversion means that the conversion is relatively slow and excess loop delay (ELD) DACs are commonly used in addition to the DACs of the SAR ADC to compensate for the delay introduced by the SAR conversion.

SUMMARY OF THE DISCLOSURE

This document describes Analog-to-Digital Converter (ADC) circuits and, in particular, an improved digital-to-analog converter (DAC) including an embedded excess loop delay (ELD) DAC used in Successive Approximation Register (SAR) quantizers that are, in turn, used in ADCs such as Continuous Time (CT) Delta-Sigma (CTDS) ADCs.

A SAR ADC converts an input signal into a digital code by successively comparing the sampled input signal with different reference levels. In sample embodiments, the input signal may be in the charge domain, the voltage domain, the current domain, or in a multi-domain configuration. A gain of an ELD DAC in a SAR quantizer is a key factor for the delta-sigma loop stability when the SAR ADC is used in a CTDS ADC. This document describes methods and devices to improve (without any reference voltage tuning) the usage of DAC units such as capacitors in the SAR ADC to save power, area, and, when capacitors are used as DAC units, load capacitance. The DAC units may also include current sources, voltage sources, and the like.

In sample embodiments, methods and devices are described for controlling excess loop delay compensation DAC (ELD DAC) gain by using DAC units such as capacitors in the ELD DAC and DACs of the SAR ADC efficiently. In sample embodiments, feedback values to control ELD gain which is normalized by DAC gain are calculated and dedicated sampling capacitors are provided to allow tuning of the gain by capacitance ratio. In addition, the ELD DAC and DAC of the SAR ADC are designed to partially share DAC units to minimize total DAC units used in the SAR quantizer while maintaining operational flexibility.

In accordance with a first aspect, a DAC of a SAR ADC is provided that includes an embedded ELD DAC. The DAC receives a SAR control signal and generates a reference level, and the ELD DAC receives an ELD feedback signal providing ELD feedback during sampling of an input analog signal. The DAC and embedded ELD DAC are characterized by a first set of DAC units and a second set of DAC units, where one or more but less than all DAC units are shared between the first and second sets of DAC units. During operation, one of the first and second sets of DAC units receive the SAR control signal during a bit trial phase and another of the first and second sets of DAC units receive the ELD feedback signal during a sampling phase.

In sample embodiments, the DAC units are used to set a gain of the DAC and a gain of the ELD DAC which is normalized by a gain of the DAC. In a sample configuration, the first set of DAC units has values related by $2^N$ where N=0 to N=n-1 or N=0 to N=n-2 for respective DAC units of an n-bit SAR ADC, and the second set of DAC units has respective values related by $2^N$ where N=-x to N=n-x-1 or N=-x+1 to N=n-x-1, where n-x DAC units are shared between the first and second sets of DAC units. During operation, the first set of DAC units receives the SAR control signal and the second set of DAC units receives the ELD feedback signal for ELD gains of less than one, while the first set of DAC units receives the ELD feedback signal and the second set of DAC units receives the SAR control signal for ELD gains of greater than one.

In sample embodiments, the DAC is incorporated into a Delta Sigma analog-to-digital converter (DS ADC). The DS ADC includes a sample/hold circuit that samples the input analog signal, a comparator that compares a difference between the sampled input analog signal and the ELD feedback signal to the reference level, a SAR and ELD logic circuit that converts outputs of the comparator into the SAR control signal representing the input analog signal and the ELD feedback signal versus the reference level, the SAR and ELD logic circuit further outputting the SAR control signal, the ELD feedback signal, and analog to digital conversion results. In sample embodiments, the DAC generates the reference level for input to the comparator during respective bit trials. The DS ADC may further include a loop filter that receives the input analog signal and the analog to digital conversion results and that provides an output to the sample/hold circuit.

In further sample embodiments, the ELD feedback signal is applied to the ELD DAC during the sampling phase and the SAR control signal is applied to the DAC during the bit trial phase and any ELD DAC units that are not shared with DAC units of the DAC are driven to a fixed DAC unit value during the bit trial phase.

In still further sample embodiments, the sample/hold circuit includes an additional sampling capacitor connected between the input analog signal and ground. The additional sampling capacitor is separate from the first and second sets of DAC units and provides flexible gain control. In sample embodiments where the DAC units are capacitors that are used to set a gain of the DAC and a gain of the ELD DAC, wherein signal gain $k_{sig}$ of the input analog signal is controlled by capacitance ratios during top plate sampling as:

$$k_{sig}=(C_{Sa}+C_D+C_{Es})/C_D,$$

where $C_{Sa}$ is a capacitance of the additional sampling capacitor, $C_D$ is a sum of the capacitances of capacitors of the DAC receiving the SAR control signal, and $C_{Es}$ is a sum of the capacitances of capacitors of the ELD DAC excluding any capacitors shared between the first and second sets of capacitors. In other embodiments, the signal gain $k_{sig}$ of the input analog signal is controlled by capacitance ratios during bottom plate sampling as:

$$k_{sig}=(C_{Sa}+C_{Ds})/C_D,$$

where $C_{Sa}$ is a capacitance of the additional sampling capacitor, $C_{Ds}$ is a sum of capacitances of the capacitors of the DAC receiving the SAR control signal used for sampling the input analog signal, and $C_D$ is a sum of capacitances of capacitors of the DAC. On the other hand, the ELD gain $k_{ELD}$ may be controlled by a capacitance ratio of:

$$k_{ELD}=C_E/C_D$$

where $C_E$ is a sum of the capacitances of the ELD DAC.

In other sample embodiments, the sample/hold circuit receives first and second differential analog inputs that are applied to respective DACs and embedded ELD DACs, each DAC and embedded ELD DAC including a first set of DAC units and a second set of DAC units, where one or more but less than all DAC units are shared between the first and second sets of DAC units. Also, one of the first and second sets of DAC units receives the SAR control signal during a bit trial phase and another of the first and second sets of DAC units receives the ELD feedback signal during a sampling phase. During operation, one of the first and second sets of DAC units of the respective DACs and embedded ELD DACs receives the SAR control signal during the bit trial phase and another of the first and second sets of units of the respective DACs and embedded ELD DACs receives the ELD feedback signal during sampling.

In accordance with a second aspect, a Successive Approximation Register (SAR) analog-to-digital converter (ADC) is provided that includes a sample/hold circuit that samples an input analog signal and an excess loop delay (ELD) feedback signal, a comparator that for each sample of the input analog signal compares the sampled ELD feedback signal with the sampled input analog signal to generate a delta, a SAR and excess loop delay (ELD) logic circuit, and a digital-to-analog converter (DAC). The SAR and ELD logic circuit conducts bit trials for each sample of the input analog signal to generate a Successive Approximation Register (SAR) control signal, the bit trials comprising, for each bit trial, generating a reference level based on the SAR control signal, comparing the delta with the reference level, and outputting the SAR control signal from the comparison result, the SAR and ELD logic circuit further generating the ELD feedback signal and analog to digital conversion results. The DAC receives the ELD feedback signal during sampling of the input analog signal during a sampling phase and conducts bit trials during a bit trial phase. The DAC has an embedded ELD DAC and comprises a first set of DAC units and a second set of DAC units, where one or more but less than all DAC units are shared between the first and second sets of DAC units. During operation, one of the first and second sets of DAC units receive the SAR control signal during the bit trial phase and another of the first and second sets of DAC units receive the ELD feedback signal during the sampling phase. In sample embodiments, the sample/hold circuit comprises a sampling capacitor connected between the input analog signal and ground. The sampling capacitor is separate from the first and second sets of DAC units and provides flexible gain control.

In accordance with a third aspect, a method of analog-to-digital conversion is provided that includes sampling an input analog signal and an excess loop delay (ELD) feedback signal that is fed back during sampling of the input analog signal. For each sample of the input analog signal, the method includes: subtracting the sampled ELD feedback signal from the sampled input analog signal to generate a delta; conducting bit trials to generate a Successive Approximation Register (SAR) control signal, the bit trials comprising, for each bit trial, generating a reference level based on the SAR control signal, comparing the delta with the reference level, and outputting the SAR control signal from the comparison result. The bit trials are conducted by a DAC having an embedded ELD DAC. The DAC and ELD DAC together include a first set of DAC units and a second set of DAC units where one or more but less than all DAC units are shared between the first and second sets of DAC units. One of the first and second sets of DAC units receives the SAR control signal during a bit trial phase and another of the first and second sets of DAC units receives the ELD feedback signal during a sampling phase. The analog to digital conversion results are generated and output.

In sample embodiments, the DAC units are capacitors. In such embodiments, sampling the input analog signal comprises using top plate sampling onto sampling capacitance $C_S=C_{Sa}+C_D+C_{Es}$, where $C_S$ is a sum of capacitances used in sampling, $C_{Sa}$ is capacitance of an additional sampling capacitor connected between the input analog signal and ground, $C_D$ is a sum of capacitances of capacitors of the DAC, and $C_{Es}$ is a sum of capacitances of capacitors of the embedded ELD DAC excluding any capacitors shared between the DAC and the ELD DAC.

In such embodiments, sampling the input analog signal also may comprise using bottom plate sampling onto sampling capacitance $C_S=C_{Sa}+C_{Ds}$, where $C_S$ is a sum of capacitances used in sampling, $C_{Sa}$ is a capacitance of an additional sampling capacitor connected between the input analog signal and ground, and $C_{Ds}$ is a sum of capacitances of capacitors of the DAC used for sampling the input analog signal. The ELD feedback signal also may be sampled to $C_E$ where $C_E$ is a sum of capacitances of ELD capacitors.

In sample embodiments where the DAC includes a first set of capacitors having respective capacitance values related by $2^N$ where N=0 to N=n−1 or N=0 to N=n−2 for respective capacitors of an n-bit SAR ADC and a second set of capacitors having respective capacitance values related by $2^N$ where N=−x to N=n−x−1 or N=−x+1 to N=n−x−1, the operations further include sharing n−x capacitors between the first and second sets of capacitors. In such embodiments, the ELD feedback signal is provided to one of the first and second sets of capacitors during sampling of the input analog signal and the SAR control signal is provided to the other of the first and second sets of capacitors during respective bit trials. In such embodiments, a set of capacitors to which the ELD feedback signal is provided is dependent upon whether a gain of the ELD feedback signal is greater than or less than one.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The following description with respect to FIGS. 1-17 sufficiently illustrates specific embodiments to enable those skilled in the art to practice them. Other embodiments may incorporate structural, logical, process, and other changes. Portions and features of some embodiments may be included in, or substituted for, those of other embodiments. Embodiments set forth in the claims encompass all available equivalents of those claims. The example embodiments are presented for illustrative purposes only and are not intended to be restrictive or limiting on the scope of the disclosure or the claims presented herein.

As noted in the background above, Successive Approximation Register analog-to-digital converters (SAR ADCs) are desirable as quantizers in Continuous Time (CT) Delta Sigma (DS) ADCs because they require low power. However, the successive nature of the conversion means that the conversion is relatively slow and excess loop delay compensation (ELD) DACs are commonly used in addition to the DACs of the SAR ADC when SAR ADCs are used as quantizers in CTDS ADCs to compensate for the delay introduced by the SAR conversion. CTDS ADCs are good at precision and low power applications and use SAR ADCs as quantizers to reduce power. This disclosure describes, among other things, techniques to improve (without any reference voltage tuning) the usage of DAC units in SAR ADCs to save power, area, and input load.

A flash ADC is a type of analog-to-digital converter that uses a linear voltage ladder or capacitive voltage division with comparators at each junction of the linear voltage ladder or capacitive division to compare the input voltage to voltage references. The outputs of the comparators are fed into a digital encoder that converts the inputs into a binary value. Flash ADCs are very fast compared to many other types of ADCs and are relatively simple in design. However, a flash ADC may require a large number of comparators compared to other ADCs, especially as the resolution is increased. For example, a flash ADC requires $2^n-1$ comparators for an n-bit conversion. The size, power consumption, and cost of all of the comparators make flash ADCs generally impractical for precisions greater than 8 bits (255 comparators).

There are significant benefits to increasing quantizer resolution, such as jitter tolerance and relaxation of delta-sigma designs, but using high resolution flash ADCs is impractical for most applications in ADCs such as Continuous Time Delta-Sigma (CTDS) ADCs. Employing SAR ADCs may save power and area for higher resolution quantizers. However, SAR ADCs require much more conversion time than flash ADCs and requires excess loop delay (ELD) compensation. To eliminate the additional compensation and DAC and a summing amplifier, ELD DACs may be embedded into SAR quantizers. Improved designs for embedding ELD DACs into SAR quantizers are described below.

Figure 1:
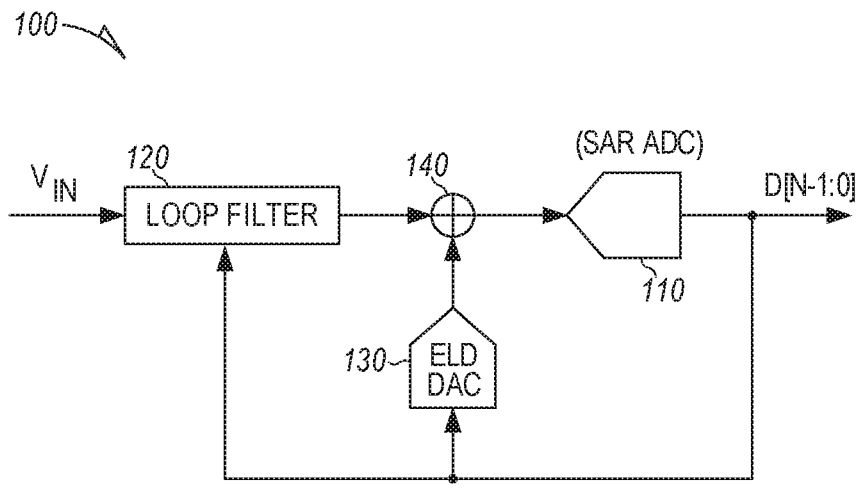
FIG. 1 is a functional block diagram of an example of a continuous-time delta sigma ADC (CTDS ADC) including a successive approximation register (SAR) analog-to-digital converter (SAR ADC) circuit.

FIG. 1 is a functional block diagram of an example of a CTDS ADC 100 including a SAR ADC circuit 110. It will be appreciated that, in certain embodiments, a Discrete Time (DT) Delta Sigma (DS) ADC may also be used. As noted above, SAR ADCs are generally desirable for use as medium to high resolution quantizers in CTDS ADCs due to their low power characteristics. As illustrated, the input analog voltage Vi is applied to a loop filter 120. To compensate for conversion delay error introduced by the SAR ADC circuit 110, an ELD DAC circuit 130 may be provided to feedback delayed versions of the output of the SAR ADC circuit 110 to add to the output of the loop filter 120 at summer 140. In particular, the ELD DAC circuit 130 functions to feedback the previous output code of SAR ADC circuit 110 and to multiply the previous reference code for loop stability.

A SAR ADC circuit 110 is a type of ADC that converts a continuous analog waveform into a discrete digital representation via a binary search through all possible quantization levels before converging on an output for each conversion. The SAR ADC circuit 110 may include a sample and hold circuit to acquire the input voltage. An analog voltage comparator compares the input voltage to the output of a DAC of the SAR ADC and outputs the result of the comparison to SAR logic having a sub-circuit that supplies an approximate digital reference code to the DAC of the SAR ADC. The DAC of the SAR ADC converts the digital reference code to a voltage reference and supplies the comparator with an analog voltage equal to the digital reference code output by the SAR. During operation, the SAR is initialized so that the most significant bit (MSB) is equal to a reset or center value, which is fed into the DAC of the SAR ADC, which then supplies the analog equivalent of this digital code (0) into the comparator circuit for comparison with the sampled input voltage. If this analog voltage exceeds the input voltage, the comparator causes the SAR to reset this bit; otherwise, the bit remains as 1. The next bit is set to 1 and the same test is done. This binary search continues until every bit in the SAR has been tested. The resulting code is the digital approximation of the sampled input voltage against input full scale range of $+/-V_{ref}$ and is output by the SAR at the end of the conversion.

Figure 2:
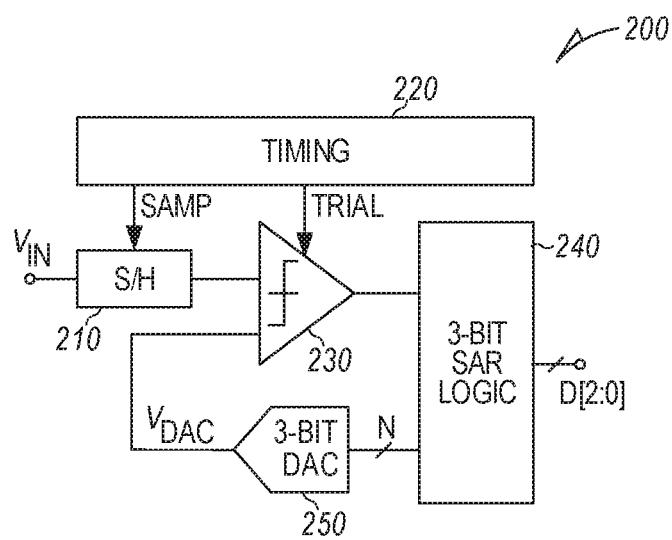
FIG. 2 is a functional block diagram of a 3-bit SAR ADC for purposes of illustrating operation of a SAR ADC.
Figure 3:
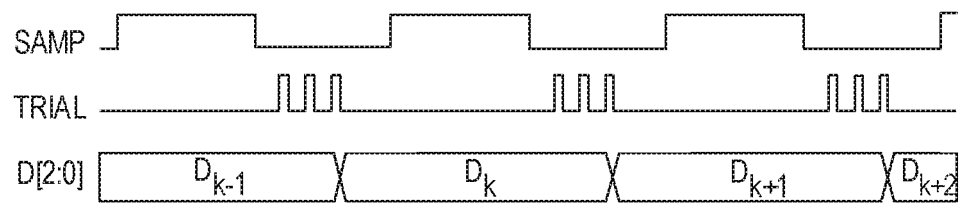
FIG. 3 illustrates timing diagrams for the operation of the 3-bit SAR ADC of FIG. 2.

FIG. 2 is a functional block diagram of a 3-bit SAR ADC 200 for purposes of illustrating operation of a SAR ADC 110. As illustrated, the input voltage VIN is sampled by a sample/hold circuit 210 at a timing determined by timing circuit 220 upon application of the sampling signal samp (FIG. 3). The sampled voltage of $V_{IN}$ is applied to a comparator 230 to compare the sampled voltage against the fed back voltage value $V_{DAC}$ of the previous output code from the 3-bit SAR logic circuit 240 as provided via 3-bit DAC 250. SAR logic circuit 240 controls the ADC operation during the bit trials. When the bit trials are complete, the digital value of the sampled and held voltage is available as output D[2:0]. The full scale for the SAR ADC is $2*V_{ref}$. As illustrated in the timing diagrams of FIG. 3, the comparator 230 is controlled at a timing determined by trial pulses from timing circuit 220 for comparison of the sampled voltage against each fed back SAR reference code to enable the successive approximation of the sampled voltage to provide SAR outputs $D_{k-1}$, $D_k$, $D_{k+1}$, $D_{k+2}$, etc.

Figure 4:
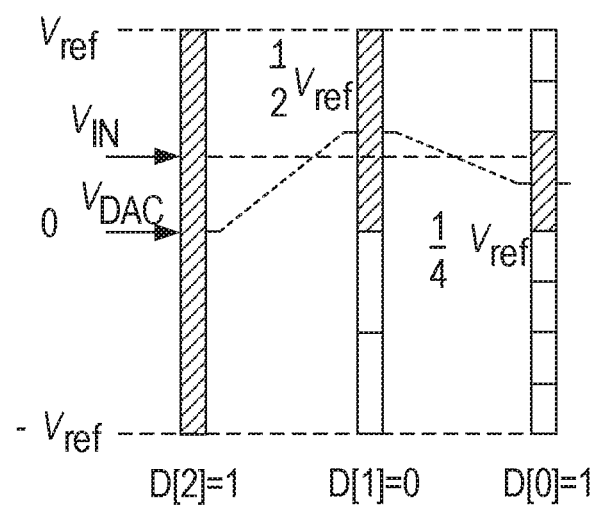
FIG. 4 illustrates a 3-bit SAR ADC approximation of Vin using the 3-bit SAR ADC of FIG. 2.

For example, as illustrated in FIG. 4 as a single-end operation for simplicity, the 3-bit SAR logic 240 would start with a $V_{DAC}$ that is the center of input full scale voltage of 0. In the illustrated case, $V_{IN}$ is greater than 0 in the first trial, so D[2]=1. In the second trial, $V_{IN}$ is compared against the mid-point of the upper range (½ $V_{ref}$). Since $V_{in}$ is less than ½ $V_{ref}$, D[1]=0. Then, in the third trial, $V_{IN}$ is compared against the mid-point of the range between ½ $V_{ref}$ and 0 (¼ $V_{ref}$). Since $V_{IN}$ is greater than ¼$V_{ref}$, D[0]=1. Thus, the 3-bit approximation of $V_{IN}$ provides an output code D[2:0] =101.

FIGS. 5A-5F together illustrate operation of the 3-bit SAR ADC example of FIGS. 2-4 where the DAC has a capacitive structure and is sampled at a top plate.

Figure 5A:
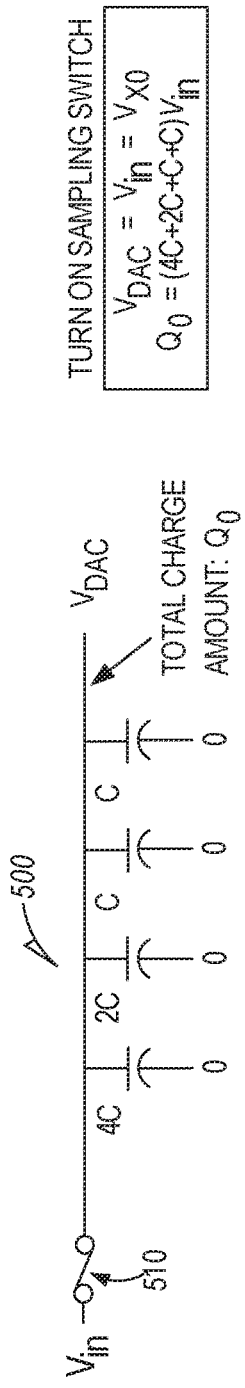
FIGS. 5A-5F together illustrate operation of the 3-bit SAR ADC example of FIGS. 2-4 where the DAC has a capacitive structure and is sampled at a top plate.

As illustrated in FIG. 5A for a DAC 500 comprising respective capacitances 4C, 2C, C, and C, the sampling switch 510 is closed for top plate sampling of $V_{in}$ and to charge the respective capacitors of the DAC 500 so that each capacitor has a charge equal to its capacitance times the input voltage minus any offset voltage. The total charge amount $Q_0$ when $V_{in}$ is sampled is $Q_0=(4C+2C+C+C)V_{in}$, where $V_{in}=V_{DAC}=V_{X0}$.

Figure 5B:
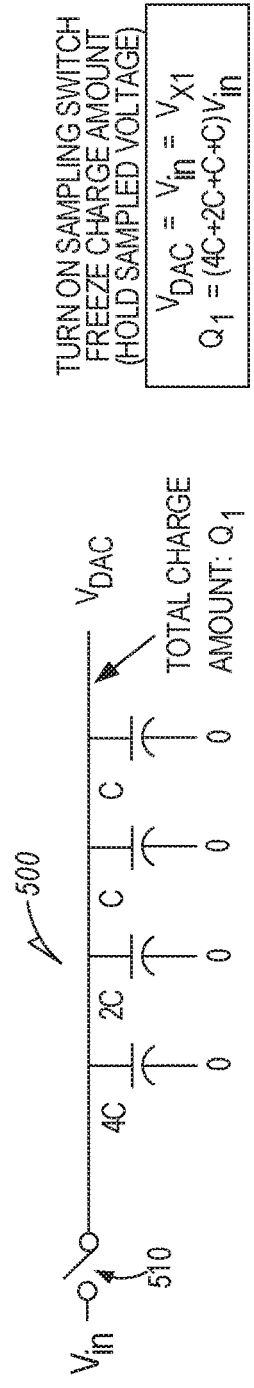

As illustrated in FIG. 5B, the sampling switch 510 is opened to freeze the charge amount (hold sampled voltage) for $V_{in}$ on the respective capacitors of the DAC 500, and $V_{DAC}$ is controlled by the bottom plate voltages. The total charge amount $Q_1$ is $Q_1=(4C+2C+C+C)V_{in}$, where $V_{in}=V_{DAC}=V_{X1}$. The first bit trial is conducted to establish whether $V_{in}$ is greater than 0. Assuming $V_{DAC}<0$, the bit D[2] is set to 0.

Figure 5C:
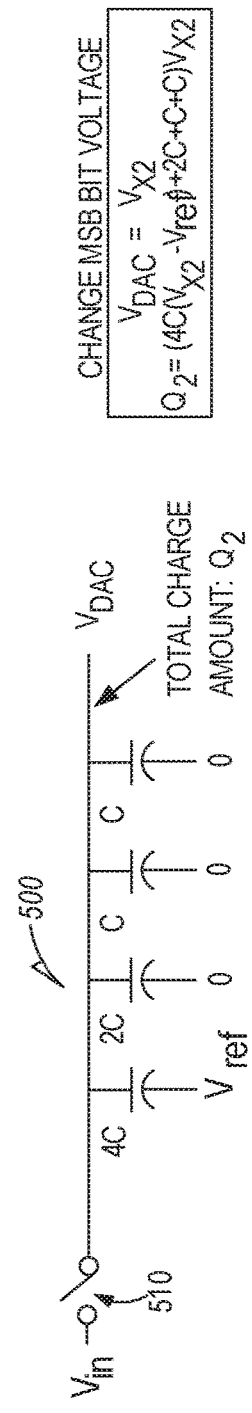

As illustrated in FIG. 5C, the sampling switch 510 remains open and as the first bit trial has set D[2]=0, $V_{ref}$ is fed back to the most significant bit capacitor 4C. In this state the total charge amount $Q_2$ at the node of $V_{DAC}$ is $Q_2=4C(V_X-V_{ref})+(2C+C+C)V_{X2}$, where $V_{DAC}=V_{X2}$. Assuming $V_{DAC}>0$, the bit D[1] is set to 1, as the output of the second bit trial.

Figure 5D:
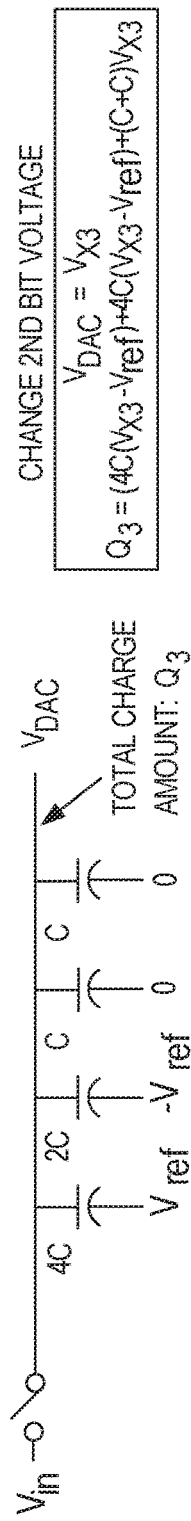

As illustrated in FIG. 5D, the sampling switch 510 remains open and as the second trial has set D[1]=1, $-V_{ref}$ is fed back to the second most significant bit capacitor 2C The total charge amount $Q_3$ is $Q_3=4C(V_{X3}-V_{ref})+4C(V_{X3}+V_{ref})+(C+C)V_{X3}$, where $V_{DAC}=V_{X3}$. Assuming $V_{DAC}<0$, the bit D[0] is set to 0, as the output of the third bit trial. This concludes the bit trial phase for a 3-bit SAR ADC.

Figure 5E:
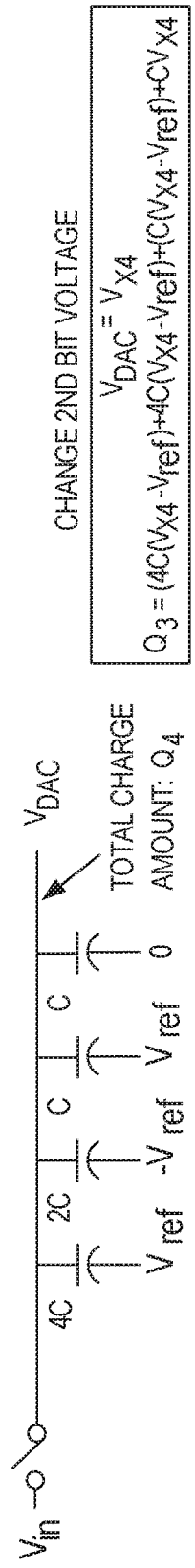

FIG. 5E illustrates the state of the capacitors for subsequent bit trials for a higher resolution SAR ADC.

Figure 5F:
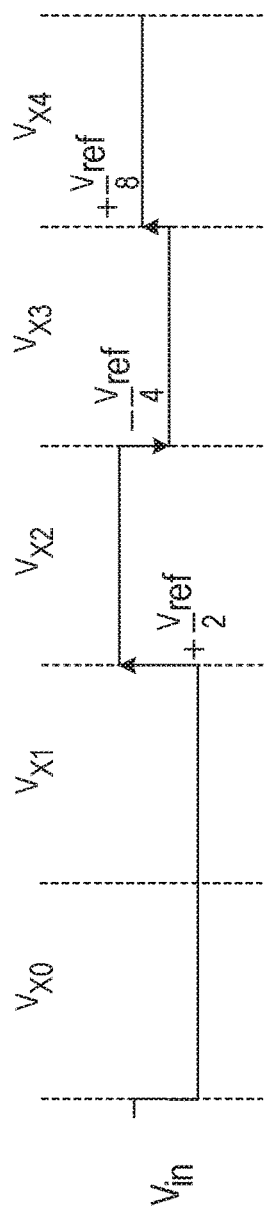

FIG. 5F illustrates the resulting approximation of $V_{in}$ for the respective steps in FIGS. 5A-5E, respectively, for output code D[2:0]=010.

Thus, the SAR ADC 110 makes N time comparisons, where N is the number of bits of the ADC, which is a relatively slow operation. However, the SAR ADC 110 requires a relative small area, many fewer comparators, and much less power than a flash ADC.

However, the ELD DAC 130 is added in the delta-sigma loop to fix conversion delay introduced by the SAR ADC 110. The ELD DAC 130 also consumes power and area. It is desired to embed at least part of the ELD DAC 130 into the SAR ADC 110 in order to reduce the area and power consumed by the ELD DAC 130. This may be accomplished in several ways.

Figure 6:
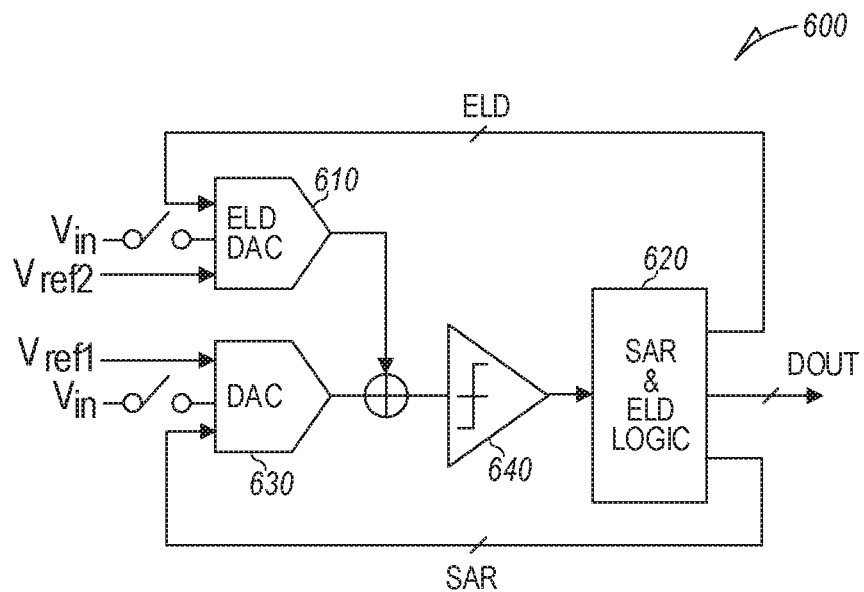
FIG. 6 illustrates a block diagram of a SAR ADC having an embedded ELD DAC.

For example, FIG. 6 illustrates a SAR ADC 600 having an embedded scaled ELD DAC 610. As illustrated, SAR and ELD logic circuit 620 provides combined ELD DAC 610 and DAC 630 with ELD signal and SAR control signal, respectively. A gain of ELD DAC 610 and a gain of DAC 630 are controlled by respective external reference voltage $V_{ref1}$ and $V_{ref2}$. A comparator 640 compares the combined ELD DAC 610 and DAC 630 output and provides SAR and ELD control logic with a comparison result. SAR and ELD control logic circuit 620 controls the operation during the bit trials based on the comparison result. When the bit trials are complete, the SAR converts the difference between the input and ELD signal into digital code dout. Unfortunately, this approach requires a second set of external reference voltages, which requires additional area and power for external reference voltage generation. Also, the circuit requires tuning to offset any errors in the reference voltages, and calibration is required to find the optimal operating conditions.

Figure 7:
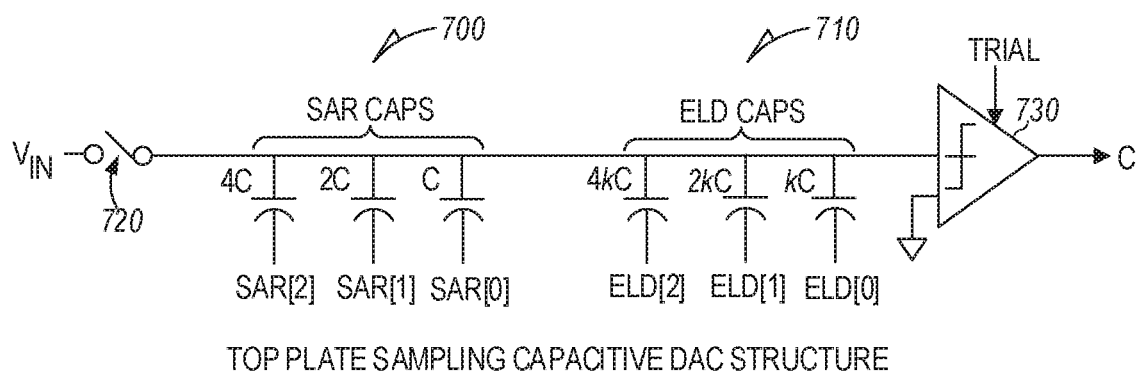
FIG. 7 illustrates a sample top plate sampling capacitive DAC structure for a DAC of a SAR ADC and an ELD DAC.

FIG. 7 illustrates a top plate sampling capacitive DAC structure for a DAC having an embedded ELD DAC. In this example, the SAR capacitors 700 and ELD capacitors 710 are connected to the top plate for sampling under control of switch 720 during respective bit trials at comparator 730. In this example, the ELD capacitors 720 have gain control values k that are provided for gain adjustment. The gains affect performance and the stability of the delta sigma loop in a CTDS ADC 100, for example. The incoming signal gain is proportional to the SAR capacitors 700 plus the ELD capacitors 710 (=(4C+2C+C)+(4kC+2kC+C) in this example). The SAR feedback gain is proportional to the SAR capacitors 700 plus the unit capacitance (=(4C+2C+C)+C), while the ELD feedback gain is proportional to the ELD capacitors 710 plus the ELD unit capacitance (=(4kC+2kC+kC)+kC). The ELD is updated at the beginning of the bit trial phase; however, these ratios must be guaranteed to maintain the stability of the delta sigma loop. Thus, the total capacitance is proportional to the gain k and the gain of the ELD DAC and DAC of the SAR ADC are tied together to maintain stability.

Figure 8:
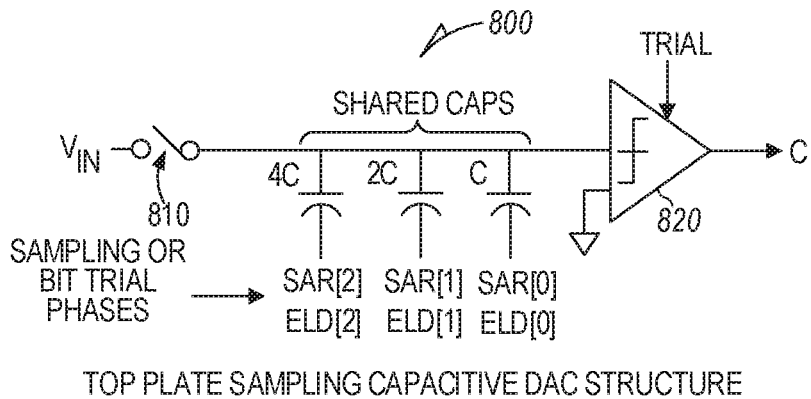
FIG. 8 illustrates a sample top plate sampling capacitive DAC structure for a DAC of a SAR ADC and an embedded ELD DAC that completely share the capacitors for use with the ELD signal during the sampling phase and with the SAR control signal during the bit trial phase.

FIG. 8 illustrates a sample top plate sampling capacitive DAC structure for a DAC of the SAR ADC and an embedded ELD DAC that completely share the capacitors 800 for use with the ELD feedback signal during the sampling phase (switch 810 closed) and with the feedback SAR signal during the bit trial phase (switch 810 open) during respective trials at comparator 820. As in the capacitive DAC structure in FIG. 7, the gains affect performance and the stability of the delta sigma loop in a CTDS ADC 100, for example. The incoming signal gain is proportional to the capacitors 800. The SAR feedback gain is proportional to the capacitors 800 plus the unit capacitance (=(4C+2C+C)+C), while the ELD feedback gain is proportional to the capacitors 800 plus the ELD unit capacitance (=(4C+2C+C)+C). Thus, the gain is only 1 and there is less flexibility for the design of the CTDS ADC.

Partially Shared Capacitors in Embedded ELD DAC

The architectures described below embed ELD DACs into DACs of a SAR ADC in such a way that lower and higher gain options are possible while limiting the capacitance area and power requirements. The embedded ELD DACs in the following embodiments are characterized in at least two ways.

First, capacitors between the DAC of the SAR ADC and ELD DAC are partially shared. In sample embodiments, parts of a DAC of the SAR ADC are used as an ELD DAC to achieve lower gain (gain of <1) while parts of an ELD DAC are used as a DAC of the SAR ADC to achieve higher gain (gain of >1). In this fashion, capacitor efficiency is enhanced while providing gains other than one without using external circuits for gain control, thereby minimizing circuit area and power and minimizing circuit complexity.

Second, signal gain is set by adding an additional sampling capacitor. The additional sampling capacitor avoids the need to use another set of reference voltages to control gain precisely. Also, an additional sampling capacitor has the benefit of requiring a small area and lower power than an external reference voltage circuit.

Figure 9:
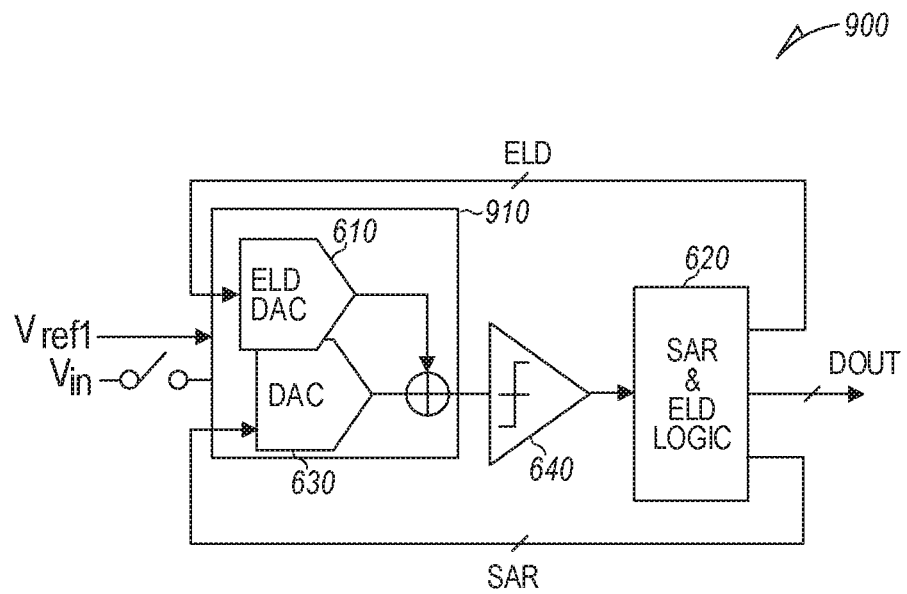
FIG. 9 illustrates a block diagram of a SAR ADC having a DAC and an embedded ELD DAC that share some but not all DAC units in a sample embodiment.

FIG. 9 illustrates a block diagram of a SAR ADC 900 having a DAC 630 and an embedded ELD DAC 610 that share DAC units in a sample embodiment. The differences between FIG. 9 and FIG. 6 are that the ELD DAC 610 and the DAC 630 share DAC units in a combined DAC 910 and that FIG. 9 uses only one reference. Though described below in the voltage domain, it will be appreciated that the systems and methods described herein may be used in the charge domain, the current domain, or in a multi-domain configuration.

While the following embodiments are described in connection with a top plate sampling operation, it will be appreciated that bottom plate sampling may also be used. It will also be appreciated that the operations may be single-ended or differential.

The goal of the embodiments described herein is to control signal, SAR ADC, and ELD DAC gains to, for example, provide CTDS ADC loop stability. The designs described herein accomplish this goal while providing minimum overhead to save power and area. For example, by partially overlapping the capacitor sets of the DAC of the SAR ADC and the ELD DAC, gain control for the DAC of the SAR ADC and ELD DAC may be achieved with less area and power.

Figure 10A:
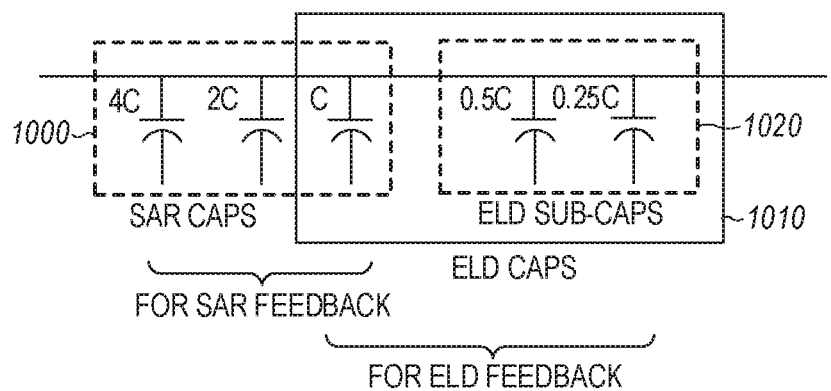
FIG. 10A illustrates a sample capacitor configuration for partial sharing of DAC and ELD DAC capacitors to provide an ELD feedback gain of less than one.

FIG. 10A illustrates a sample capacitor configuration for partial sharing of DAC of the SAR ADC and ELD DAC capacitors to provide an ELD feedback gain of less than one. As illustrated, the SAR capacitors 1000 (4C, 2C, and C) share capacitance C with the ELD capacitors 1010 (C, 0.5C, 0.25C). In this example, the ELD sub-capacitors 0.5C and 0.25C 1020 are added to the SAR capacitors 1000 to provide the ELD capacitors set related in the same $2^n$ relationship with each other. Also, since the SAR capacitances 1000 range to 4C while the ELD capacitances 1010 range to C, the ELD feedback gain may be controlled down to 0.25 (C/4C). This variable gain is achieved with significantly less capacitance space due to the C, 0.5C, 0.25C capacitance sizes versus the 4C, 2C, C capacitances used when the DAC of the SAR ADC and the ELD DAC are totally separate. Thus, unlike the configuration of FIG. 8, ELD feedback gain is flexible as the ELD gain may be lowered by shifting bits.

Figure 10B:
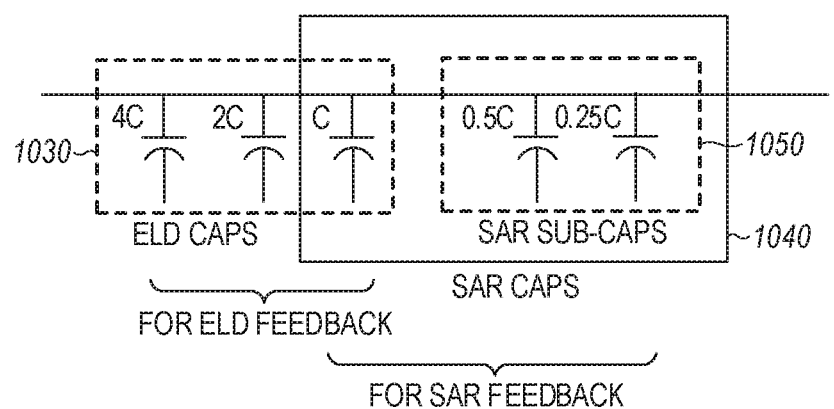
FIG. 10B illustrates a sample capacitor configuration for partial sharing of DAC and ELD DAC capacitors to provide a ELD feedback gain of greater than one.

On the other hand, FIG. 10B illustrates a sample capacitor configuration for partial sharing of DAC of the SAR ADC and ELD DAC capacitors to provide a SAR feedback gain of greater than one. As illustrated, the ELD capacitors 1030 (4C, 2C, and C) share capacitance C with the SAR capacitors 1040 (C, 0.5C, 0.25C). It will be appreciated that the SAR capacitors and ELD capacitors are reversed from FIG. 10A. In this example, the SAR sub-capacitors 0.5C and 0.25C 1050 are added to the ELD capacitors 1030 to provide the SAR capacitors set related in the same $2^n$ relationship with each other. Also, since the ELD capacitances 1030 range to 4C while the SAR capacitances 1040 range to C, the SAR feedback gain may be controlled up to 4 (4C/C). This variable gain is achieved with significantly less capacitance space due to the C, 0.5C, 0.25C capacitance sizes versus the 4C, 2C, C capacitances used when the DAC of the SAR ADC and the ELD DAC are totally separate. Thus, unlike the configuration of FIG. 8, the SAR feedback gain is flexible as the SAR gain may be increased by shifting bits.

FIGS. 11A-11F illustrate how partial sharing of the DAC capacitances 1000 and ELD DAC capacitances 1010 (FIG. 10) may be used to achieve an ELD gain of 0.25. In the sampling phase, the ELD gain is adjusted by the ELD DAC capacitances, while during the bit trial phase, bit trials are run through comparator 1100 under control of SAR and ELD logic 1110, which in turn generates the 3-bit conversion SAR output D[2:0] as well as the SAR feedback code SAR[2:0] and the ELD feedback code ELD[2:0]. As illustrated for a 3-bit combined SAR/ELD DAC in FIG. 11A, the SAR capacitors 1000 receive the output feedback SAR code SAR[2:0] at SAR capacitances 4C, 2C, and C, respectively. However, the 3-bit ELD DAC feedback code ELD[2:0] is respectively fed back to capacitance C of the SAR capacitances 1000 and the ELD sub-capacitances 0.5C and 0.25C as illustrated. This operation is controlled by the same timing signals samp and trial as described above with respect to FIGS. 2-4. During bit trials SAR[x]=1 implies a voltage of −Vref will be applied to the DAC of the SAR ADC during the next bit trial, while SAR[x]=0 implies Vref voltage will be applied to the DAC of the SAR ADC during the next bit trial, where x=2, 1, or 0, indicating bits for a 3-bit output. During sampling phase, the ELD[x]=1, implies Vref will be applied to the ELD DAC, while ELD[x]=0, implies −Vref voltage will be applied to the ELD DAC, where x=2, 1, or 0. During sampling phase, the ELD feedback code ELD[2:0] will be mapped to the SAR output $D_{k-1}$ [2:0], where $D_{k-1}$ is the SAR output from the previous conversion cycle. During the bit trials the non-shared ELD sub-capacitors 1020 are driven to a fixed value, and they remain in this state for all the bit trials. In this example the fixed value is mapped to ground with a value of 0.

Figure 11A:
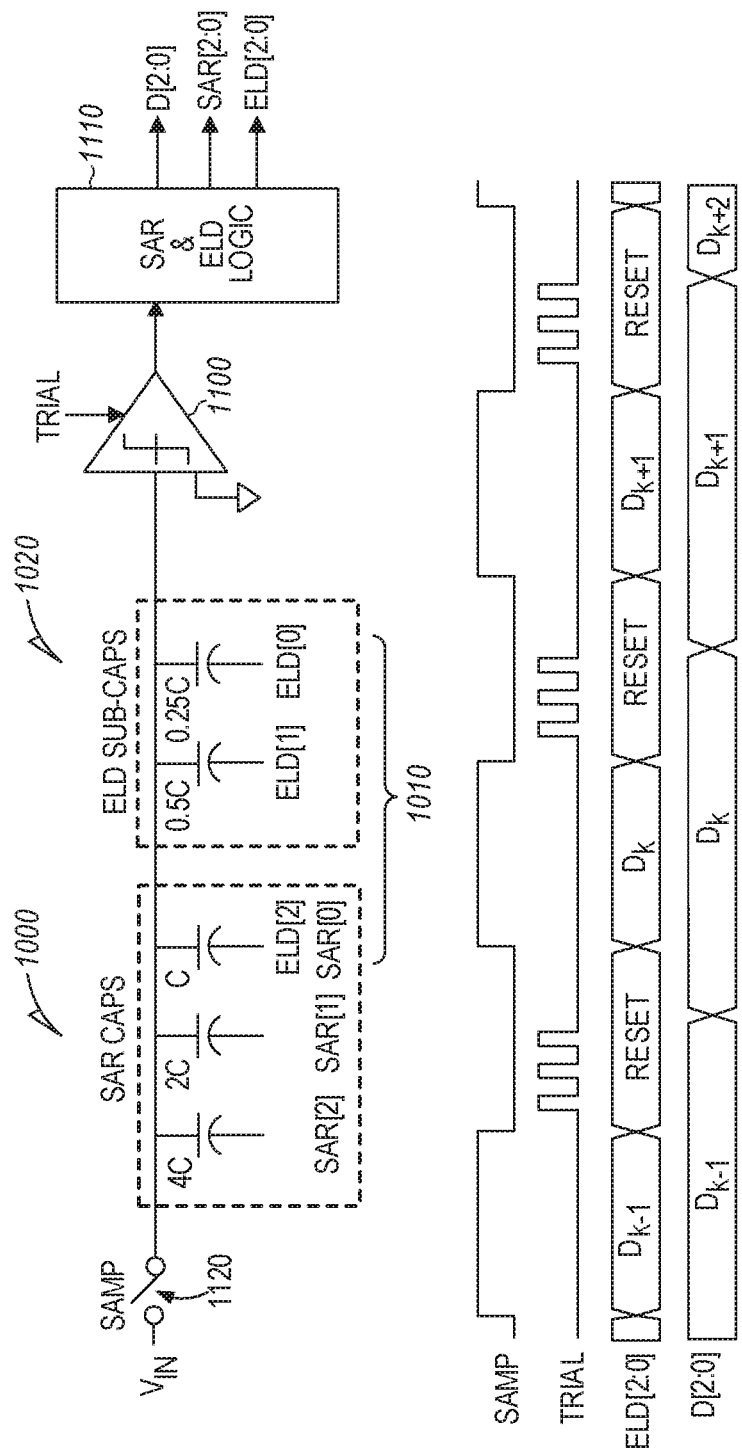
FIGS. 11A-11F illustrate how partial sharing of the DAC capacitances and ELD DAC capacitances may be used to achieve an ELD feedback gain of 0.25.
Figure 11B:
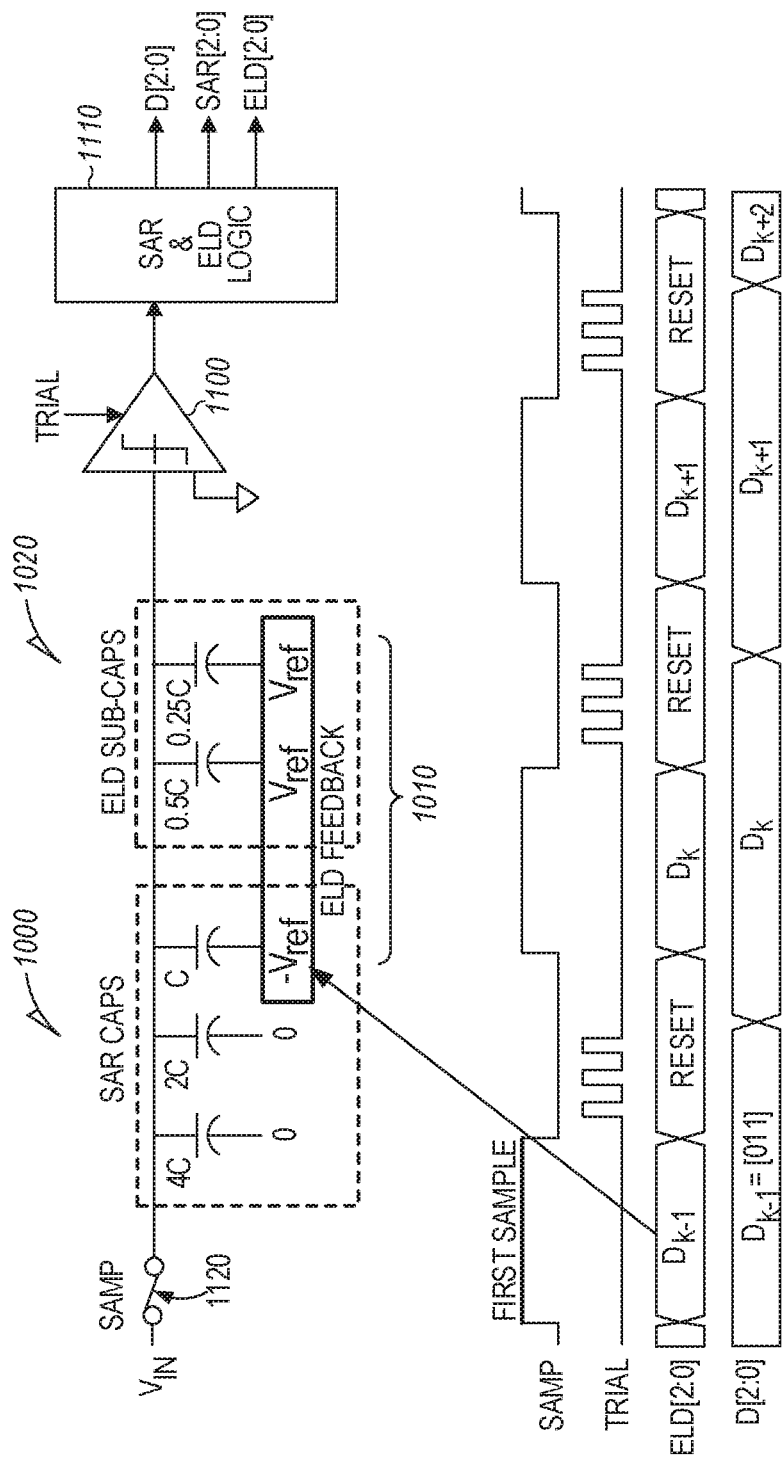

As illustrated in FIG. 11B, during an input sampling of the first sample, the ELD DAC feedback code ELD[2:0] (=$D_{k-1}$=[011]) is received. The ELD feedback is applied to the ELD capacitors 1010 during sampling phase for ELD subtraction phase by applying $-V_{ref}$ to SAR capacitance C as ELD[2]=[0], $V_{ref}$ to ELD capacitance 0.5C as ELD[1]=[1], and $V_{ref}$ to ELD capacitance 0.25C as ELD[0]=[1]. Once the ELD has been adjusted during the sampling phase, the bit trials for the first sample may begin. It will be appreciated that since the charge subtraction occurs immediately in the sampling phase that the charge on the capacitors already represents the subtraction value.

Figure 11C:
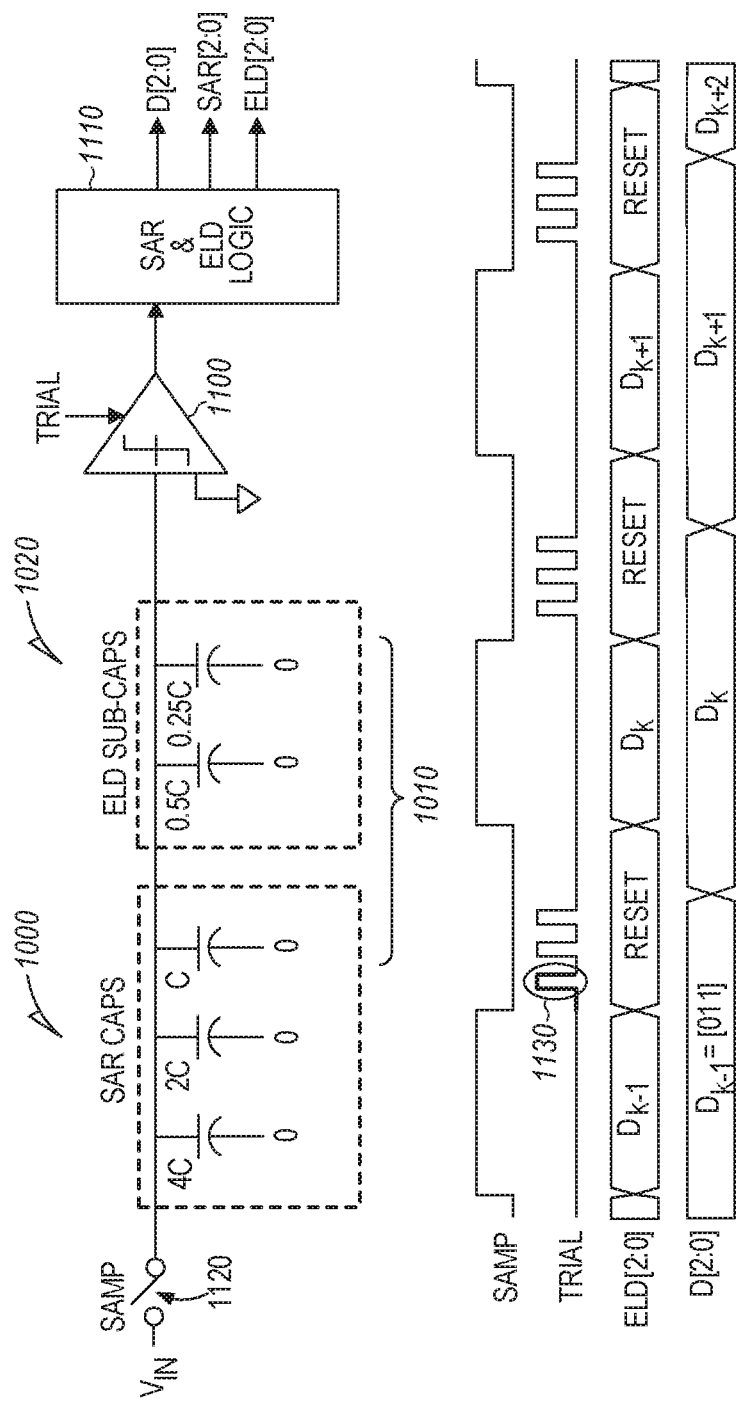

FIG. 11C illustrates the first trial during the bit trial phase of the partially shared DAC 1000 and ELD DAC 1010. During the first trial initiated by trial bit 1130, the switch 1120 is opened and the all capacitances start at ground. The charge of the sampled signal is distributed across the capacitances. Assuming that in this state the comparator 1100 outputs a state of 1, the SAR and ELD logic block will set bits D[2] as 1, and SAR [2] as 1.

Figure 11D:
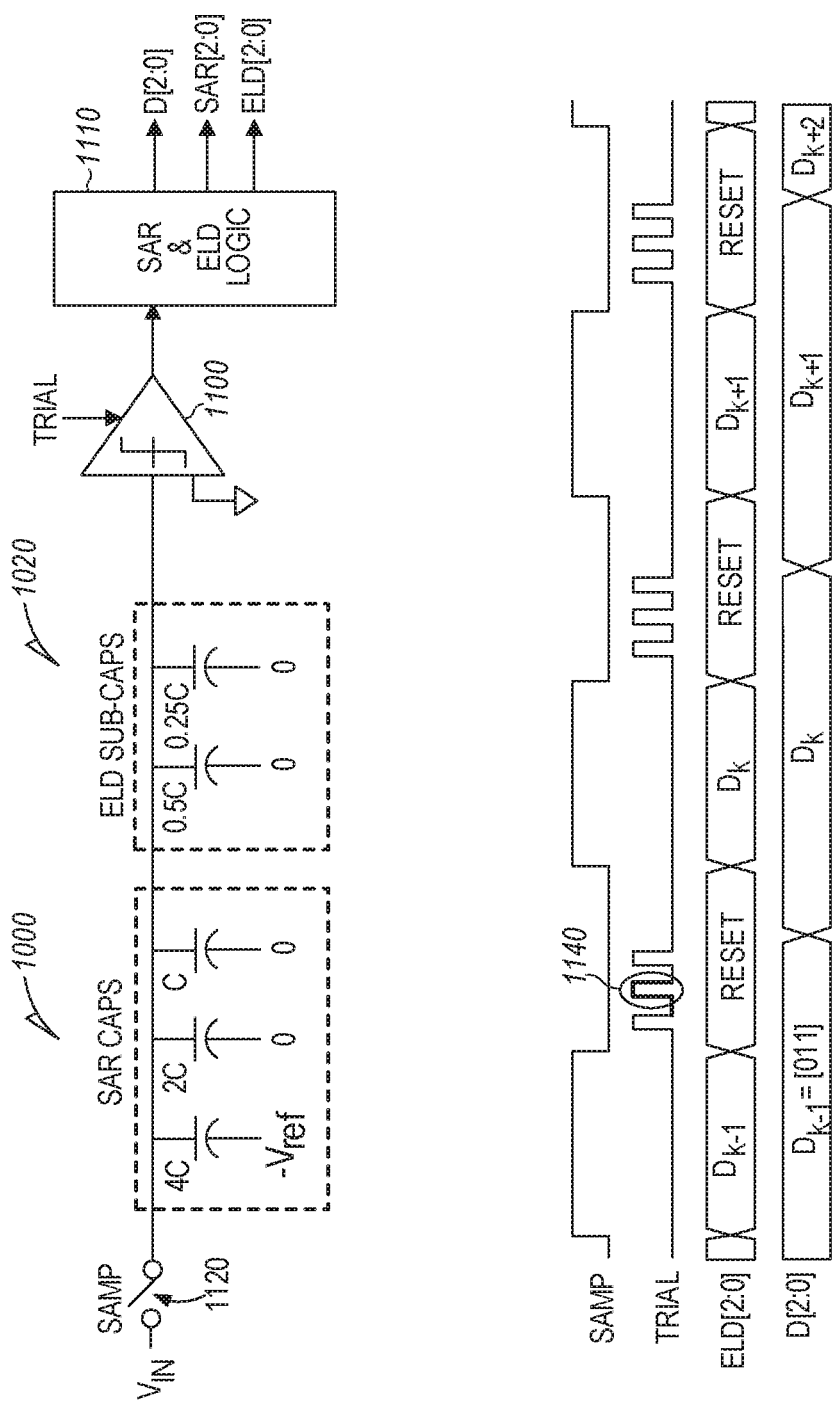

FIG. 11D illustrates the second trial during the bit trial phase of the partially shared DAC and ELD DAC. During the second trial initiated by trial bit 1140, the switch 1120 remains opened and as SAR[2]=[1], voltage $-V_{ref}$ is applied to SAR capacitance 4C. Assuming that in this state the comparator 1100 outputs a state of 0, the SAR and ELD logic block will set D[1] as 0, and SAR [1] as 0.

Figure 11E:
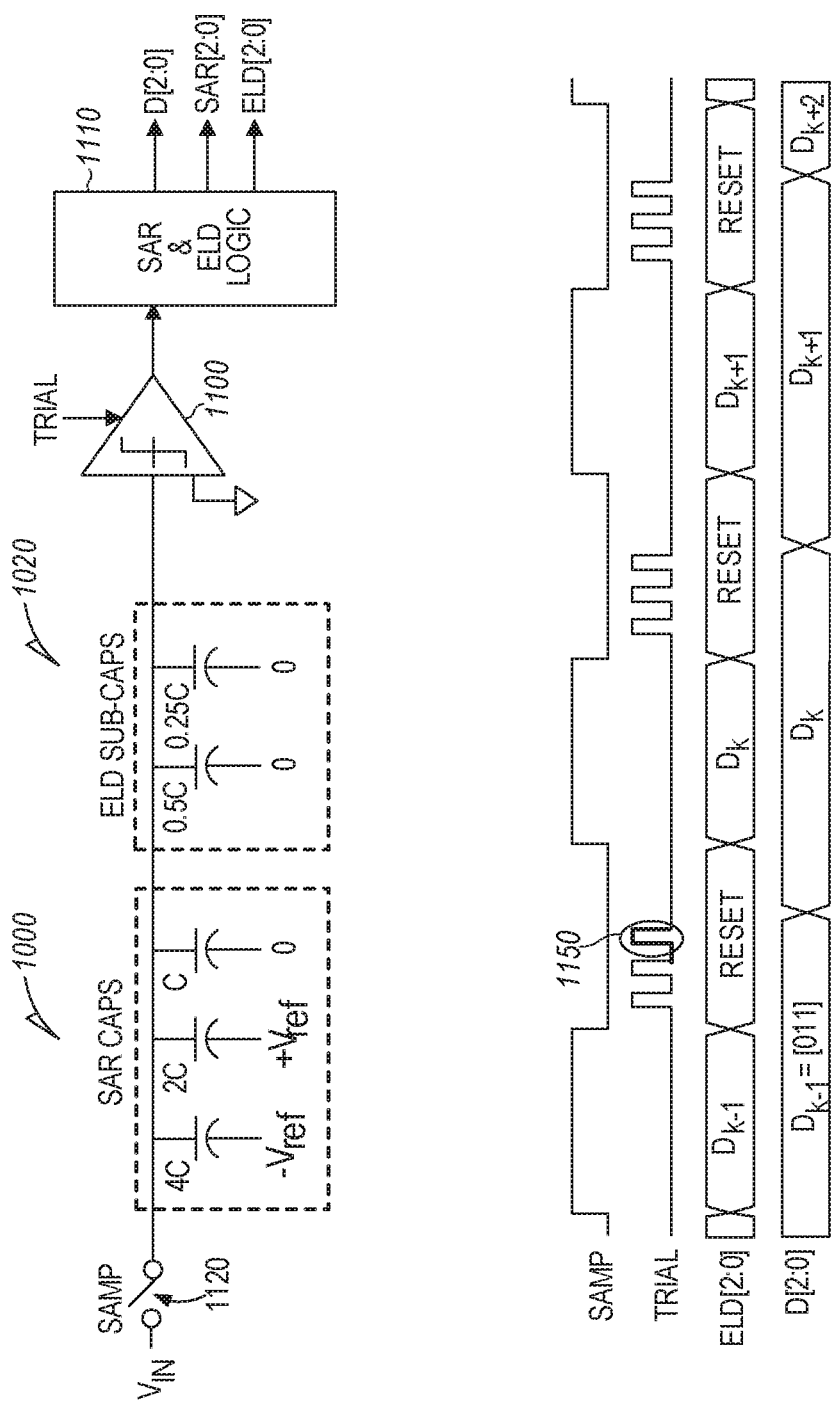

FIG. 11E illustrates the third trial during the bit trial phase of the partially shared DAC and ELD DAC. During the third trial initiated by trial bit 1150, the switch 1120 remains opened and the as SAR[1]=[0], voltage $+V_{ref}$ is applied to SAR capacitance 2C. Assuming that in this state the comparator 1100 outputs a state of 1, the SAR and ELD logic block will set D[0] as 1, and SAR [0] as 1, At this point the SAR output $D_k$ [2:0] is set to [101], and this marks the end of the first conversion cycle.

Figure 11F:
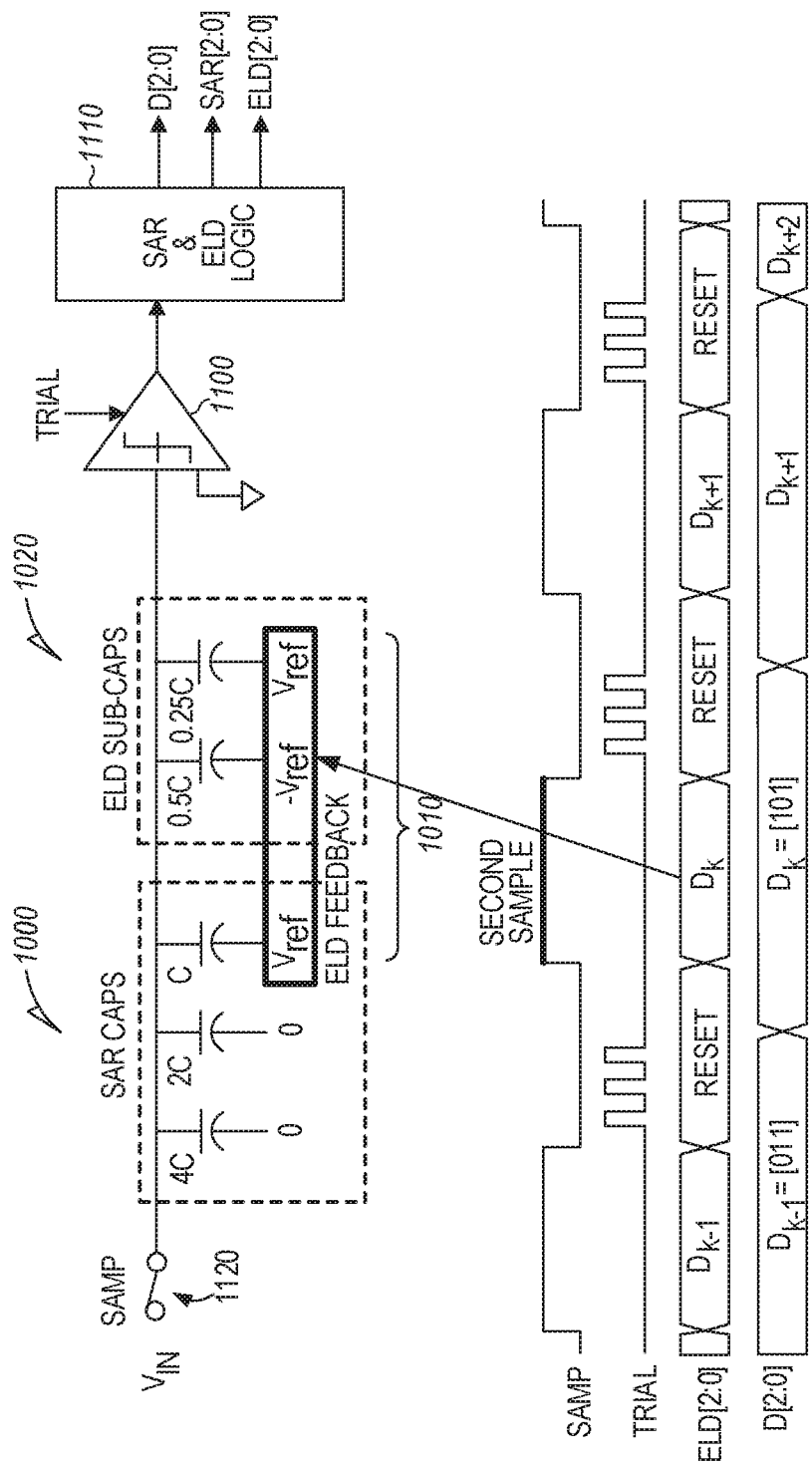

As illustrated in FIG. 11F, the second conversion cycle begins by sampling a second input sample, switch 1120 is closed and the ELD DAC feedback code ELD[2:0] is received and mapped to the SAR output $D_k$ [2:0]=[101], from the first conversion. ELD feedback is applied to the ELD capacitors 1010 by applying $+V_{ref}$ to SAR capacitance C for ELD[2]=[1], $-V_{ref}$ to ELD capacitance 0.5C for ELD[1]=[0], and $+V_{ref}$ to ELD capacitance 0.25C for ELD[0]=[1]. Once the ELD has been adjusted, the bit trials for the second sample may begin. Once again, since the charge subtraction occurs immediately in the sampling phase, the charge on the capacitors already represents the subtraction value.

Figure 12:
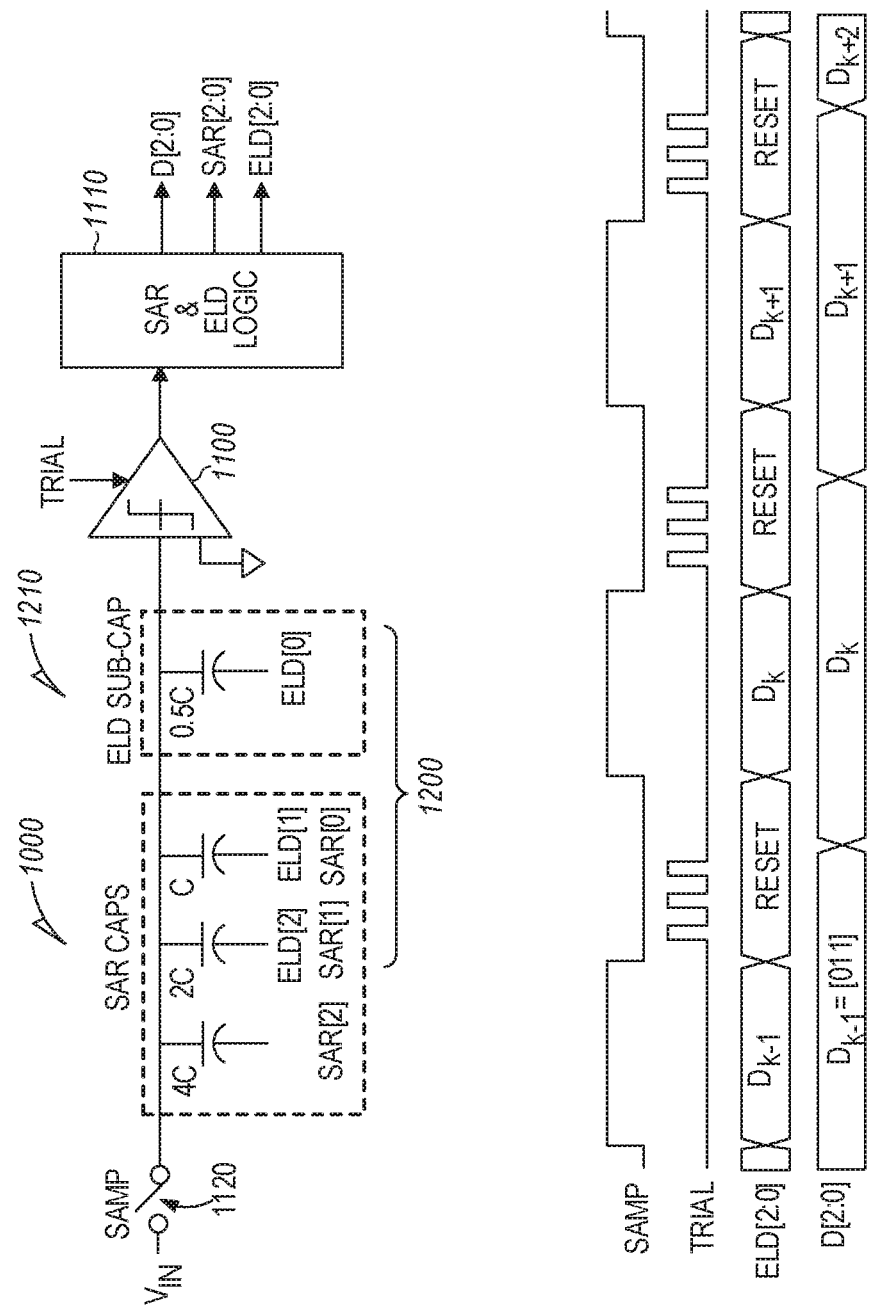
FIG. 12 illustrates a sample capacitor configuration for partial sharing of DAC and ELD DAC capacitors to provide an ELD feedback gain of 0.5.

FIG. 12 illustrates a sample capacitor configuration for partial sharing of DAC of the SAR ADC and ELD DAC capacitors to provide an ELD feedback gain of 0.5. As illustrated, the SAR capacitors 1000 (4C, 2C, and C) share capacitances 2C and C with the ELD capacitors 1200 (2C, C, 0.5C). In this example, only the ELD sub-capacitor 0.5C 1210 is added to the SAR capacitors 1000 to provide the ELD capacitors set related in the same $2_n$ relationship with each other. Also, since the SAR capacitances 1000 range to 4C while the ELD capacitances 1200 range to 2C, the ELD feedback gain may be controlled down to 0.5 (2C/4C). This variable gain is achieved with significantly less capacitance space since only the 0.5C capacitance is added to the DAC capacitances. The trials would proceed in a similar manner as described above with respect to FIG. 11 except that the ELD digital output codes would be applied to two of the capacitors of the SAR capacitors 1000 due to the additional bit shift.

More generally, the relationship between the respective sets of capacitor arrays of the DAC of the SAR ADC may be described as follows. A first set of capacitors has respective capacitance values C related by $2^N$ where N=0 to N=n−1 for respective capacitors of an n-bit SAR ADC. Thus, for the 3-bit SAR ADC described herein, n=3 and N=0-2. Thus, the capacitance values are related as 1 ($2^0$), 2 ($2^1$), and 4 ($2^2$). Also, for embodiments where the DAC of the SAR ADC is one bit smaller than the ELD DAC, the values C may be related by $2^N$ where N=0 to N=n−2 for respective capacitors of an n-bit SAR ADC. A second set of capacitors has respective capacitance values C related by $2^N$ where N=−x to N=n−x−1, where n−x capacitors are shared between the first and second sets of capacitors. In the above examples, if one capacitor is shared for a 3-bit SAR ADC, n=3. Since n−x=1, x=2 and $2^{-x}$=¼. Thus, the second set of capacitors has values of ¼ of the first set of capacitors. On the other hand, if two capacitors are shared for a 3-bit SAR ADC, n=3 and n−x=2. So, x=1 and $2^{-x}$=½. Thus, the second set of capacitors has values of ½ of the first set of capacitors. Also, for embodiments where the DAC of the SAR ADC is one bit smaller than the ELD DAC, the values C may be related by $2^N$ where N=−x+1 to N=n−x−1 for respective capacitors of an n-bit SAR ADC. As described with respect to FIGS. 10-11, the ELD gain may be less than one or greater than one in accordance with the set of capacitors to which the ELD digital output code is applied for gain adjustment.

Figure 13:
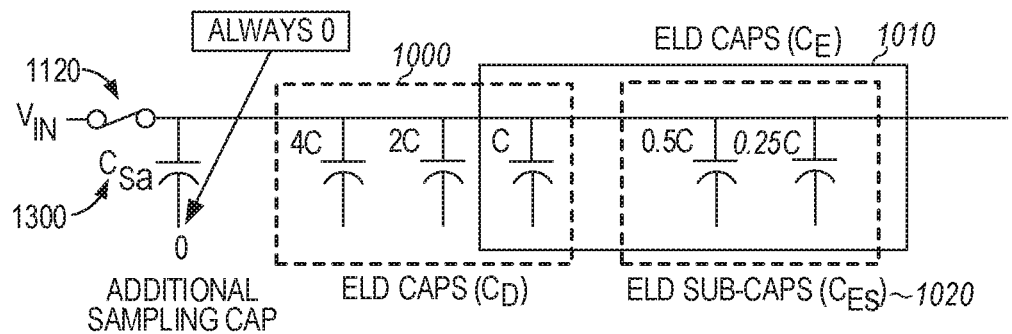
FIG. 13 illustrates a further embodiment in which the signal gain is further controlled by providing an additional sampling capacitor.

FIG. 13 illustrates a further embodiment in which the signal gain is further controlled by providing an additional sampling capacitor 1300. Though the illustrated additional sampling capacitor C. 1300 is connected to the top plate, it will be appreciated that the additional sampling capacitor C. 1300 also may be connected to the bottom plate. The additional sampling capacitor C. 1300 is always connected to ground and functions to provide an offset voltage that permits the SAR sampling to be held in a narrower range for refined gain control. For example, if $V_{in}$ is in the voltage range of 0-3V, the additional sampling capacitor $C_{sa}$ 1300 may be used to level shift down to a 1.1V comparator range for a more refined gain control. Also, this permits the overall signal gain to be adjusted independently of the gain control for the DAC of the SAR ADC and ELD DAC. Also, through use of the additional sampling capacitor $C_{sa}$ 1300, external reference generation may not be required.

In FIG. 13, the gains are controlled by the capacitance ratios. For example, all the gains are normalized by a gain of the DAC of the SAR ADC and the signal gain $k_{sig}$ may be defined for top plate sampling as:

$$k_{sig}=(C_{Sa}+C_D+C_{Es})/C_D.$$

where $C_{Sa}$ is a capacitance of the additional sampling capacitor, $C_D$ is a sum of the capacitances of the SAR capacitors 1000, $C_E$ is a sum of the capacitances of the ELD capacitors 1010, and $C_{Es}$ is a sum of the capacitances of the ELD sub-capacitors 1020. In the case of bottom plate sampling, the signal gain $k_{sig}$ of the input analog signal is controlled by capacitance ratios as:

$$k_{sig}=(C_{Sa}+C_{Ds})/C_D,$$

where $C_{Sa}$ is a capacitance of the additional sampling capacitor, $C_{Ds}$ is a sum of capacitances of capacitors of the DAC of the SAR ADC used for sampling the input analog signal, and $C_D$ is a sum of capacitances of capacitors of the DAC. Also, the ELD gain $k_{ELD}$ may be defined as:

$$k_{ELD}=C_E/C_D.$$

It will be appreciated that, in the case of bottom plate sampling, the shared DAC units are already used in ELD signal sampling and they cannot also sample the input signal. As a result, only the non-shared portion of the DAC of the SAR ADC may be used for sampling. In addition, it is not necessary to sample an input signal to all the non-shared DAC capacitors. One may select which capacitor in the DAC of the SAR ADC to use to sample the input signal, unlike top plate sampling which requires all capacitors to be sampled. For example, only the most significant bit (MSB) capacitor of the DAC of the SAR ADC, which is usually half of the DAC of the SAR ADC, samples the input signal to reduce the complexity of a control circuit without an additional sampling capacitor. Then, $C_{Sa}=0$ (no additional sampling capacitor), $C_{Ds}=C_D/2$ (only half of DAC samples an input signal), so $k_{sig}=(0+C_D/2)/C_D=0.5$.

Figure 14:
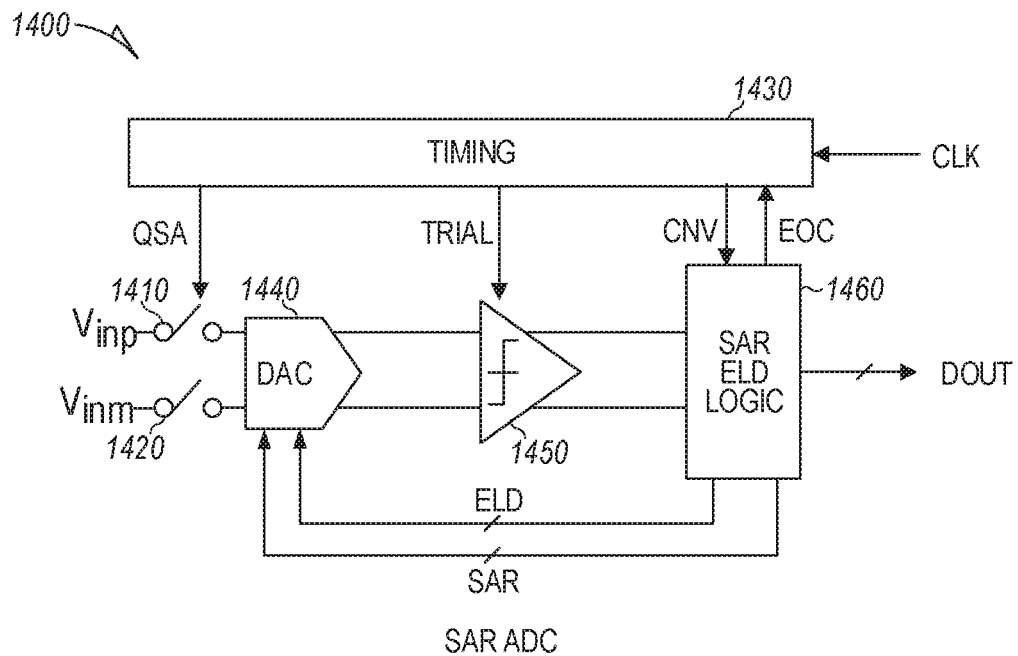
FIG. 14 is a functional block diagram of an example of a differential SAR quantizer sharing a DAC and an ELD DAC.

FIG. 14 is a functional block diagram of an example of a differential SAR quantizer 1400 including a differential shared capacitance SAR/ELD DAC. In this example, a differential analog input voltage is sampled and held using a sampling circuit that opens/closes switches 1410/1420 under control of a sampling signal qsa from timing circuit 1430 to provide differential input voltages $V_{ip}$, and Vim to the SAR/ELD DAC 1440. The differential output voltages are gain controlled by SAR/ELD DAC 1440 as described above with respect to FIGS. 9-13, and the output of the SAR/ELD DAC 1440 is compared to the sampled and held voltage using comparator circuit 1450. The bit values of the SAR/ELD DAC 1440 are adjusted based on the output of the comparator circuit 1450. Bit trials are conducted under control of SAR/ELD logic 1460 during the bit trial phase in response to conversion signal cnv from the timing circuit 1430 to generate the digital value of the sampled and held voltage, which is output by SAR/ELD logic 1460 as dout. The SAR/ELD logic 1460 notifies the timing circuit 1430 when the conversion has been completed by providing an end of conversion (eoc) signal to the timing circuit 1430.

Figure 15:
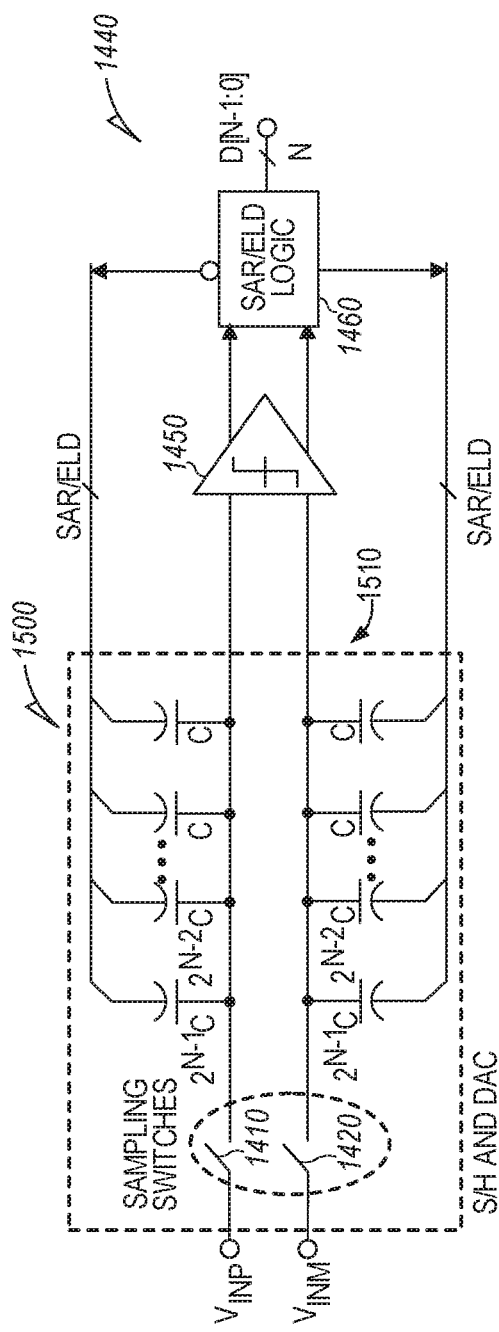
FIG. 15 illustrates a sample differential top plate sampling SAR quantizer configuration which uses capacitors as DAC units and sharing a DAC and an ELD DAC completely.

In some sample implementations, the SAR/ELD DAC 1440 may include two switched capacitor DAC (CDAC) arrays of the type illustrated in FIG. 15. In this embodiment, a first CDAC 1500 referred to as "P-DAC" is connected to a non-inverting input of the comparator 1450, and a second CDAC referred to as "N-DAC" 1510 is connected to an inverting input of the comparator 1450. Each CDAC includes a plurality of capacitors, each capacitor having first and second plates. Each of the capacitors of the CDAC arrays 1500/1510 has an associated switch that is operable to selectively connect a first plate, e.g., the lowermost or "bottom" plate to either a first reference voltage $V_{refp}$ or to a second reference voltage $V_{refn}$ depending on the bit trial result. Generally, $V_{refn}$ corresponds to ground and $V_{refp}$ is positive relative to $V_{refn}$. The respective CDAC arrays 1500/1510 may implement the partial overlapping DAC of the SAR ADC and ELD DAC described herein with respect to FIGS. 9-13.

Figure 16:
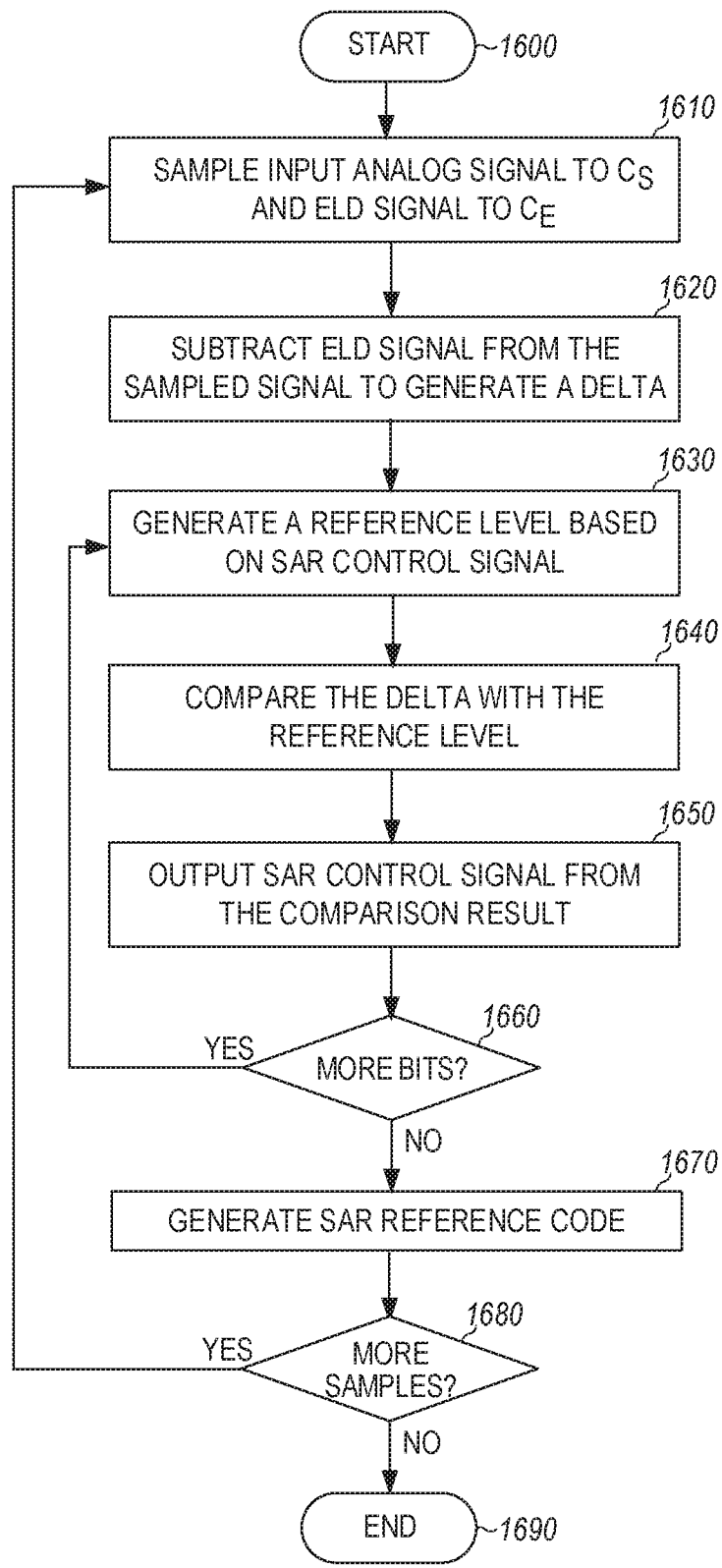
FIG. 16 is a flow chart illustrating a technique for performing successive approximation register analog to digital conversion with embedded excess loop delay compensation operation in a sample embodiment.

FIG. 16 is a flow chart illustrating a technique for performing analog to digital conversion in a sample embodiment. As illustrated, the method starts at 1600 by sampling an input analog signal to $C_S$ at 1610. If top plate sampling is used, $C_S=C_{Sa}+C_D+C_{es}$, where $C_S$ is the sum of the capacitance used in sampling, $C_{Sa}$ is the additional sampling capacitance, $C_D$ is the sum of the DAC capacitance, and $C_{es}$ is the sum of the ELD DAC capacitance excluding shared capacitance between the DAC and the ELD DAC. On the other hand, if bottom plate sampling is used, $C_S=C_{Sa}+C_{Ds}$, where $C_{Ds}$ is the sum of the DAC capacitance used in the sampling operation. The ELD signal is also sampled to $C_E$ where $C_E$ is the sum of the capacitances of the ELD capacitors. At 1620, the ELD signal is subtracted from the sampled analog signal to generate a delta. Then, during bit trials operations 1630-1660 are repeated for each bit. In particular, a reference level is generated at 1630 based on the SAR control signal. The delta found at 1620 is compared at 1640 with the reference level. A SAR control signal is output at 1650 based on the comparison result at 1640. If additional bits are to be tested at 1660, operations 1630-1650 are repeated for each bit. Once all bits have been tested, the SAR reference code is generated at 1670. If additional samples are available, operations 1610-1670 are repeated at 1680. Once all samples have been processed, the operations end at 1690.

As noted above, in sample embodiments the DAC of the SAR ADC includes a first set of capacitors having respective capacitance values C related by $2^N$ where N=0 to N=n−1 or N=0 to N=n−2 for respective capacitors of an n-bit SAR ADC and a second set of capacitors having respective capacitance values C related by $2^N$ where N=−x to N=n−x−1 or N=−x+1 to N=n−x−1, where n−x capacitors are shared between the first and second sets of capacitors. The ELD digital output is provided to one of the first and second sets of capacitors receiving the ELD digital reference code during sampling of the input analog voltage. The set of capacitors to which the ELD digital output code is provided is dependent upon whether the ELD gain is greater than or less than one. The embedded ELD DAC adjusts the ELD gain during sampling of the input analog voltage. On the other hand, the SAR digital reference code is provided to the other of the first and second sets of capacitors of the DAC during respective bit trials at operations 1630-1650.

Figure 17:
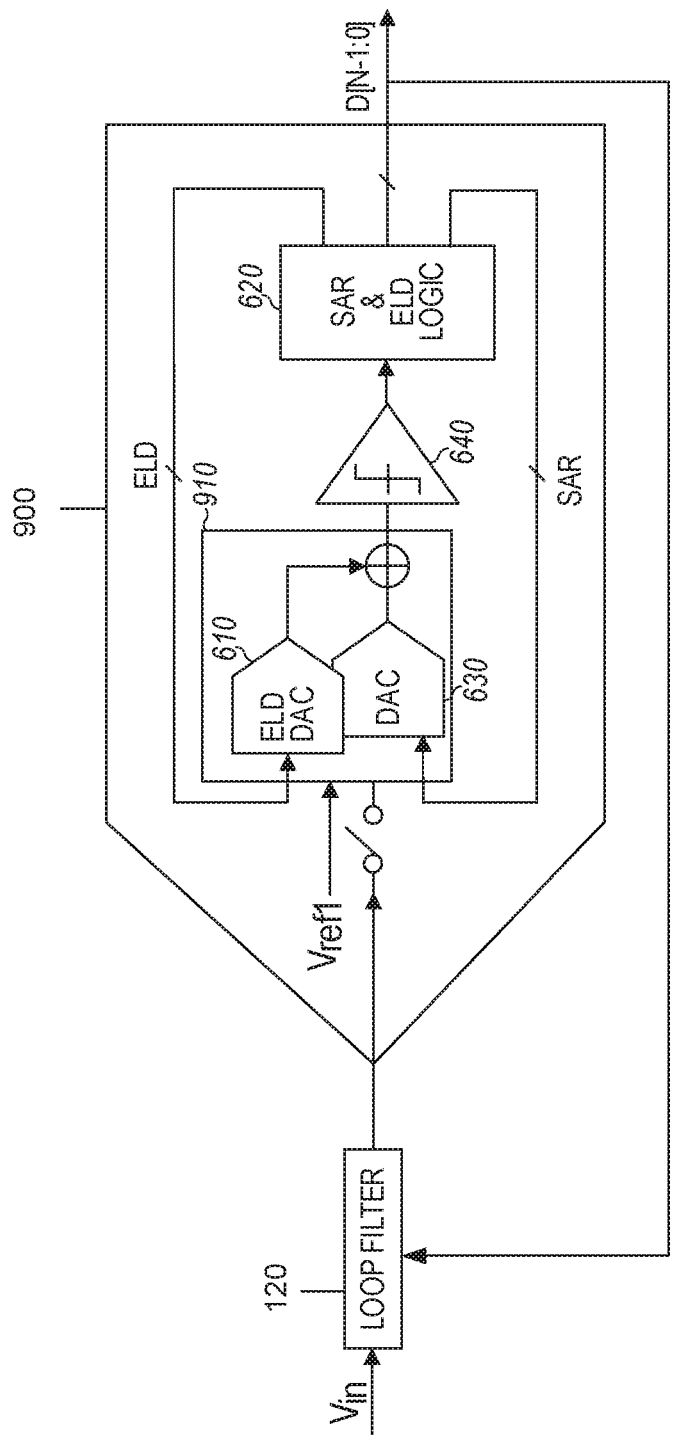
FIG. 17 is a functional block diagram of an example of a Continuous Time Delta Sigma ADC (CTDS ADC) including a successive approximation register (SAR) analog-to-digital converter (SAR ADC) with embedded ELD DAC circuit in a sample embodiment.

FIG. 17 is a functional block diagram of an example of a Delta Sigma ADC (DS ADC) including a successive approximation register (SAR) analog-o-digital converter (SAR ADC) circuit in a sample embodiment. As illustrated, the SAR ADC of FIG. 9 is provided with the loop filter 120 to convert analog signal VN to digital signal D[N−1:0].

The techniques and circuit configurations described herein may be implemented in an integrated circuit device. Reducing the overall capacitance needed to perform the ADC operations may allow an integrated circuit to operate in a reduced area at reduced power consumption, particularly for battery-powered applications.

The above description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein. In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including"

and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A Successive Approximation Register (SAR) analog-to-digital converter (ADC) having a digital-to analog converter (DAC) comprising an embedded Excess Loop Delay (ELD) DAC, the DAC receiving a SAR control signal and generating a reference level and the ELD DAC receiving an ELD feedback signal providing ELD feedback during sampling of an input analog signal, the DAC and embedded ELD DAC comprising a first set of DAC units and a second set of DAC units, where one or more but less than all DAC units are shared between the first and second sets of DAC units, one of the first and second sets of DAC units receiving the SAR control signal during a bit trial phase and another of the first and second sets of DAC units receiving the ELD feedback signal during a sampling phase.

2. The ADC of claim 1, wherein the DAC units are used to set a gain of the DAC and a gain of the ELD DAC, the first set of DAC units having values related by $2^N$ where N=0 to N=n−1 or N=0 to N=n−2 for respective DAC units of an n-bit SAR ADC, and the second set of DAC units having respective values related by $2^N$ where N=−x to N=n−x−1 or N=−x+1 to N=n−x−1, where n−x DAC units are shared between the first and second sets of DAC units.

3. The ADC of claim 2, wherein the first set of DAC units receives the SAR control signal and the second set of DAC units receives the ELD feedback signal for ELD gains of less than one.

4. The ADC of claim 2, wherein the first set of DAC units receives the ELD feedback signal and the second set of DAC units receives the SAR control signal for ELD gains of greater than one.

5. The ADC of claim 1, further comprising:
a sample/hold circuit that samples the input analog signal;
a comparator that compares a difference between the sampled input analog signal and the ELD feedback signal to the reference level; and
a SAR and excess loop delay (ELD) logic circuit that converts outputs of the comparator into the SAR control signal representing the input analog signal and the ELD feedback signal versus the reference level, the SAR and ELD logic circuit further outputting the SAR control signal, the ELD feedback signal, and analog to digital conversion results,
wherein the DAC generates the reference level for input to the comparator during respective bit trials.

6. The ADC of claim 5, further comprising a loop filter that receives the input analog signal and the analog to digital conversion results and provides an output to the sample/hold circuit.

7. The ADC of claim 5, wherein the ELD feedback signal is applied to the ELD DAC during the sampling phase and the SAR control signal is applied to the DAC during the bit trial phase and any DAC units of the ELD DAC that are not shared with DAC units of the DAC are driven to a fixed DAC unit value during the bit trial phase.

8. The ADC of claim 5, wherein the sample/hold circuit comprises an additional sampling capacitor connected between the input analog signal and ground, the additional sampling capacitor being separate from the first and second sets of DAC units and providing flexible gain control.

9. The ADC of claim 8, wherein the DAC units are capacitors that are used to set a gain of the DAC and a gain of the ELD DAC, and wherein signal gain $k_{sig}$ of the input analog signal is controlled by capacitance ratios during top plate sampling as:

$$k_{sig}=(C_{Sa}+C_D+C_{Es})/C_D.$$

where $C_{Sa}$ is a capacitance of the additional sampling capacitor, $C_D$ is a sum of the capacitances of capacitors of the DAC receiving the SAR control signal, and $C_{Es}$ is a sum of the capacitances of capacitors of the ELD DAC excluding any capacitors shared between the first and second sets of DAC units.

10. The ADC of claim 8, wherein the DAC units are capacitors that are used to set a gain of the DAC and a gain of the ELD DAC, and wherein signal gain $k_{sig}$ of the input analog signal is controlled by capacitance ratios during bottom plate sampling as:

$$k_{sig}=(C_{Sa}+C_{Ds})/C_D.$$

where $C_{Sa}$ is a capacitance of the additional sampling capacitor, $C_{Ds}$ is a sum of capacitances of capacitors of the DAC receiving the SAR control signal used for sampling the input analog signal, and $C_D$ is a sum of capacitances of capacitors of the DAC.

11. The ADC of claim 5, wherein an ELD gain $k_{ELD}$ is controlled by a capacitance ratio of:

$$k_{ELD}=C_E/C_D.$$

where $C_E$ is a sum of the capacitances of capacitors of the ELD DAC.

12. The ADC of claim 5, wherein the sample/hold circuit receives first and second differential analog inputs that are applied to respective DACs and embedded ELD DACs, each DAC and embedded ELD DAC including a first set of DAC units and a second set of DAC units, where one or more but less than all DAC units are shared between the first and second sets of DAC units, one of the first and second sets of DAC units receiving the SAR control signal during the bit trial phase and another of the first and second sets of DAC units receiving the ELD feedback signal during the sampling phase.

13. The ADC of claim 12, wherein one of the first and second sets of DAC units of the respective DACs and embedded ELD DACs receives the SAR control signal during the bit trial phase and another of the first and second sets of DAC units of the respective DACs and embedded ELD DACs receives the ELD feedback signal during the sampling phase.

14. A Successive Approximation Register (SAR) analog-to-digital converter (ADC), comprising:
a sample/hold circuit that samples an input analog signal and an excess loop delay (ELD) feedback signal;
a comparator that for each sample of the input analog signal compares the sampled ELD feedback signal with the sampled input analog signal to generate a delta;
a SAR and excess loop delay (ELD) logic circuit that conducts bit trials for each sample of the input analog signal to generate a Successive Approximation Register (SAR) control signal, the bit trials comprising, for each bit trial, generating a reference level based on the SAR control signal, comparing the delta with the reference level, and outputting the SAR control signal from the comparison result, the SAR and ELD logic circuit further generating the ELD feedback signal and analog to digital conversion results; and
a digital-to analog converter (DAC) that receives the ELD feedback signal during sampling of the input analog signal during a sampling phase and conducts bit trials during a bit trial phase, the DAC having an embedded ELD DAC and comprising a first set of DAC units and a second set of DAC units, where one or more but less than all DAC units are shared between the first and second sets of DAC units, one of the first and second sets of DAC units receiving the SAR control signal during the bit trial phase and another of the first and second sets of DAC units receiving the ELD feedback signal during the sampling phase.

15. The ADC of claim 14, wherein the sample/hold circuit comprises a sampling capacitor connected between the input analog signal and ground, the sampling capacitor being separate from the first and second sets of DAC units and providing flexible gain control.

16. A method of analog-to-digital conversion, comprising:
sampling an input analog signal and an excess loop delay (ELD) feedback signal that is fed back during sampling of the input analog signal; and
for each sample of the input analog signal:
subtracting the sampled ELD feedback signal from the sampled input analog signal to generate a delta;
conducting bit trials to generate a Successive Approximation Register (SAR) control signal, the bit trials comprising, for each bit trial, generating a reference level based on the SAR control signal, comparing the delta with the reference level, and outputting the SAR control signal from the comparison result, wherein the bit trials are conducted by a digital-to-analog converter (DAC) having an embedded ELD DAC and comprising a first set of DAC units and a second set of DAC units, where one or more but less than all DAC units are shared between the first and second sets of DAC units, one of the first and second sets of DAC units receiving the SAR control signal during a bit trial phase and another of the first and second sets of DAC units receiving the ELD feedback signal during a sampling phase; and
generating analog to digital conversion results.

17. The method of claim 16, wherein the DAC units are capacitors and sampling the input analog signal comprises using top plate sampling onto sampling capacitance $C_S=C_{Sa}+C_D+C_{Es}$, where $C_S$ is a sum of capacitances of capacitors used in sampling, $C_{Sa}$ is a capacitance of an additional sampling capacitor connected between the input analog signal and ground, $C_D$ is a sum of capacitances of capacitors of the DAC, and $C_{Es}$ is a sum of capacitances of capacitors of the embedded ELD DAC excluding any capacitors shared between the DAC and the ELD DAC.

18. The method of claim 16, wherein the DAC units are capacitors and sampling the input analog signal comprises using bottom plate sampling onto sampling capacitance $C_S=C_{Sa}+C_{Ds}$, where $C_S$ is a sum of capacitances used in sampling, $C_{Sa}$ is a capacitance of an additional sampling capacitor connected between the input analog signal and ground, and $C_{Ds}$ is a sum of capacitances of capacitors of the DAC used for sampling the input analog signal.

19. The method of claim 16, wherein the DAC includes a first set of capacitors having respective capacitance values related by $2^N$ where N=0 to N=n−1 or N=0 to N=n−2 for respective capacitors of an n-bit SAR ADC and a second set of capacitors having respective capacitance values related by $2^N$ where N=−x to N=n−x−1 or N=−x+1 to N=n−x−1, further comprising sharing n−x capacitors between the first and second sets of capacitors.

20. The method of claim 19, further comprising providing the ELD feedback signal to one of the first and second sets of capacitors during sampling of the input analog signal and providing the SAR control signal to the other of the first and second sets of capacitors during respective bit trials, wherein a set of capacitors to which the ELD feedback signal is provided is dependent upon whether a gain of the ELD feedback signal is greater than or less than one.

21. A circuit comprising:
a first digital to analog converter (DAC) comprising a first set of capacitors or current sources; and
a second DAC comprising a second set of capacitors or current sources, wherein at least one, but fewer than all, of the capacitors or current sources is shared by the first and second sets, one of the first set or the second set performing a bit trial on an input signal during a conversion phase of the input signal and another of the first set or the second set compensating a bit trial conversion delay during a sampling phase of the input signal.

22. The circuit of claim 21, further comprising a circuit that generates, from a comparison result of an output of the first DAC with an output of the second DAC, a Successive Approximation Register (SAR) control signal that is provided to the one of first set or the second set to control operation of the bit trial during the conversion phase and that generates a bit trial conversion delay feedback signal that is provided to the other of the first set or the second set to compensate, during the sampling phase, for bit trial conversion delay introduced during the conversion phase.

23. The circuit of claim 22, wherein the one of the first set or the second set is used to set a gain of the first DAC and the other of the first set or the second set is used to set a gain of the second DAC.

24. The circuit of claim 23, wherein the first set receives the SAR control signal and the second set receives the bit trial conversion delay feedback signal for a feedback loop gain of less than one.

25. The circuit of claim 23, wherein the first set receives the bit trial conversion delay feedback signal and the second set receives the SAR control signal for a feedback loop gain of greater than one.

26. The circuit of claim 22, further comprising:
a sample/hold circuit that samples the input signal; and
a comparator that compares a difference between the sampled input signal and the bit trial conversion delay feedback signal to a reference level, provided by the first DAC during the conversion phase, to generate the comparison result.

27. The circuit of claim 26, further comprising a loop filter that receives the input signal and a digital conversion of the input signal and provides an output to the sample/hold circuit.

28. The circuit of claim 26, wherein the sample/hold circuit comprises a sampling capacitor connected between the input signal and ground.

29. The circuit of claim 28, wherein the first set and second set comprise capacitors that are used to set a gain of the first DAC and a gain of the second DAC, and wherein signal gain $k_{sig}$ of the input signal during top plate sampling is controlled by a relationship between individual factors including: (1) a capacitance of the sampling capacitor ($C_{Sa}$), (2) a sum of capacitances of capacitors of the one of the first set or the second set receiving the SAR control signal ($C_D$), and ($_3$) a sum of capacitances of capacitors of the other of the first set or the second set excluding any capacitors shared between the first set and the second set ($C_{Es}$).

30. The circuit of claim 28, wherein the first set nd second set comprise capacitors that are used to set a gain of the first DAC and a gain of the second DAC, and wherein signal gain $k_{sig}$ of the input signal during bottom plate sampling is controlled by a relationship between individual factors including: (1) a capacitance of the sampling capacitor ($C_{Sa}$), (2) a sum of capacitances of capacitors of the one of the first set or the second set receiving the SAR control signal used for sampling the input signal ($C_{Ds}$), and (3) a sum of capacitances of capacitors of the first DAC ($C_D$).

31. The circuit of claim 26, wherein a feedback loop gain $k_{ELD}$ in response to the bit trial conversion delay feedback signal is controlled by a relationship between: (1) a sum of the capacitances of capacitors of the second DAC ($C_E$); and (2) a sum of capacitances of capacitors of the first DAC ($C_D$).

32. A method of analog-to-digital conversion, comprising:
performing a bit trial on an input signal during a conversion phase using one of a first set of capacitors or current sources of a first digital to analog converter (DAC) or a second set of capacitors or current sources of a second DAC; and
compensating a bit trial conversion delay during a sampling phase of the input signal using another of the first set or the second set,
wherein at least one, but fewer than all, of the capacitors or current sources is shared by the first and second sets.

33. The method of claim 32, further comprising:
receiving a sample of the input signal and a sample of a bit trial conversion delay feedback signal that is fed back during sampling of the input signal; and
for a sample of the input signal:
subtracting the sampled bit trial conversion delay feedback signal from the sampled input signal to generate a difference; and
conducting at least one bit trial using the sampled input signal and the difference, and using the at least one bit trial to generate a Successive Approximation Register (SAR) control signal, the one of the first set or the second set receiving the SAR control signal during the conversion phase and the other of the first set or the second set receiving the bit trial conversion delay feedback signal during the sampling phase.

34. The method of claim 32, further comprising setting a gain of the first DAC using the one of the first set or the second set and setting a gain of the second DAC using the other of the first set or the second set.

35. The method of claim 34, further comprising providing the bit trial conversion delay feedback signal to a set of capacitors or current sources based upon whether a feedback loop gain is greater than or less than one.

* * * * *

UNITED STATES PATENT AND TRADEMARK OFFICE
CERTIFICATE OF CORRECTION

PATENT NO. : 10,886,937 B1
APPLICATION NO. : 16/654930
DATED : January 5, 2021
INVENTOR(S) : Bandyopadhyay et al.

It is certified that error appears in the above-identified patent and that said Letters Patent is hereby corrected as shown below:

In the Claims

In Column 16, Line 61, in Claim 9, delete "$K_{sig}=(C_{Sa}+C_D+C_{Es})/C_D$." and insert --$K_{sig}=(C_{Sa}+C_D+C_{Es})/C_D$,-- therefor In Column 17, Line 7, in Claim 10, delete "$K_{sig}=(C_{Sa}+C_{Ds})/C_D$." and insert --$K_{sig}=(C_{Sa}+C_{Ds})/C_D$,-- therefor In Column 17, Line 16, in Claim 11, delete "$K_{ELD}=C_E/C_D$." and insert --$K_{ELD}=C_E/C_D$,-- therefor In Column 19, Line 52, in Claim 29, delete "($_3$)" and insert --(3)-- therefor In Column 20, Line 1, in Claim 30, delete "nd" and insert --and-- therefor In Column 20, Line 22, in Claim 32, delete "(I)AC)" and insert --(DAC)-- therefor Signed and Sealed this
Thirtieth Day of March, 2021

Drew Hirshfeld
*Performing the Functions and Duties of the*
*Under Secretary of Commerce for Intellectual Property and*
*Director of the United States Patent and Trademark Office*